US009054183B2

(12) United States Patent
Fursin et al.

(10) Patent No.: US 9,054,183 B2
(45) Date of Patent: Jun. 9, 2015

(54) TRENCHED AND IMPLANTED ACCUMULATION MODE METAL-OXIDE-SEMICONDUCTOR FIELD-EFFECT TRANSISTOR

(71) Applicants: Leonid Fursin, Monmouth Junction, NJ (US); Xueqing Li, East Brunswick, NJ (US)

(72) Inventors: Leonid Fursin, Monmouth Junction, NJ (US); Xueqing Li, East Brunswick, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 47 days.

(21) Appl. No.: 13/940,751

(22) Filed: Jul. 12, 2013

(65) Prior Publication Data

US 2014/0015036 A1 Jan. 16, 2014

Related U.S. Application Data

(60) Provisional application No. 61/671,265, filed on Jul. 13, 2012.

(51) Int. Cl.

| H01L 29/80 | (2006.01) |
|---|---|
| H01L 29/78 | (2006.01) |
| H01L 29/66 | (2006.01) |
| H01L 29/06 | (2006.01) |
| H01L 21/265 | (2006.01) |
| H01L 29/423 | (2006.01) |

(52) U.S. Cl.
CPC ...... H01L 29/7827 (2013.01); H01L 29/66666 (2013.01); H01L 21/26586 (2013.01); H01L 29/4236 (2013.01); H01L 29/7828 (2013.01); H01L 29/0623 (2013.01); H01L 29/0696 (2013.01)

(58) Field of Classification Search
CPC ... H01L 21/82347; H01L 29/76; H01L 29/80; H01L 29/94; H01L 29/0696; H01L 29/0619; H01L 29/0623; H01L 29/7395; H01L 29/7828; H01L 29/7838; H01L 29/66068
USPC .......... 257/330–341, E29.118, 136, 197, 258
See application file for complete search history.

(56) References Cited

U.S. PATENT DOCUMENTS

| 5,777,346 | A | * | 7/1998 | Temple .......................... 257/120 |
|---|---|---|---|---|
| 5,998,834 | A | * | 12/1999 | Williams et al. .............. 257/330 |
| 6,049,108 | A | * | 4/2000 | Williams et al. .............. 257/341 |
| 6,545,316 | B1 | * | 4/2003 | Baliga ........................... 257/329 |
| 6,800,897 | B2 | * | 10/2004 | Baliga ........................... 257/328 |
| 6,940,110 | B2 | * | 9/2005 | Takahashi et al. ............ 257/288 |
| 7,400,014 | B2 | * | 7/2008 | Thapar .......................... 257/330 |
| 7,518,189 | B1 | * | 4/2009 | Hackler et al. ................ 257/347 |
| 7,629,647 | B2 | * | 12/2009 | Hueting et al. ............... 257/331 |
| 8,084,813 | B2 | * | 12/2011 | Konstantinov et al. ....... 257/330 |
| 8,288,220 | B2 | * | 10/2012 | Hull et al. ..................... 438/212 |
| 8,629,509 | B2 | * | 1/2014 | Ryu et al. ...................... 257/378 |
| 8,710,510 | B2 | * | 4/2014 | Zhang et al. .................... 257/77 |
| 8,878,292 | B2 | * | 11/2014 | Hebert et al. ................. 257/332 |
| 2006/0267090 | A1 | * | 11/2006 | Sapp et al. .................... 257/341 |
| 2008/0012050 | A1 | * | 1/2008 | Aoki et al. .................... 257/262 |
| 2011/0254100 | A1 | * | 10/2011 | Xiao et al. .................... 257/369 |

* cited by examiner

*Primary Examiner* — Michael Lebentritt
(74) *Attorney, Agent, or Firm* — Baker & Hostetler LLP

(57) ABSTRACT

The present invention provides AccuFETs with single or dual accumulation channels and methods for manufacturing the same. The present invention also provides for products produced by the methods of the present invention and for apparatuses used to perform the methods of the present invention.

40 Claims, 34 Drawing Sheets

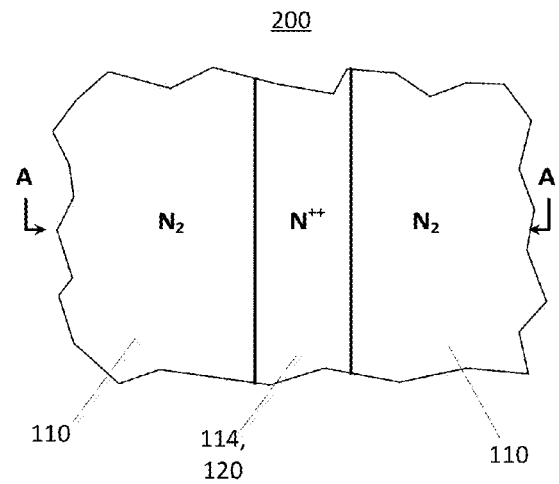
FIG. 2E
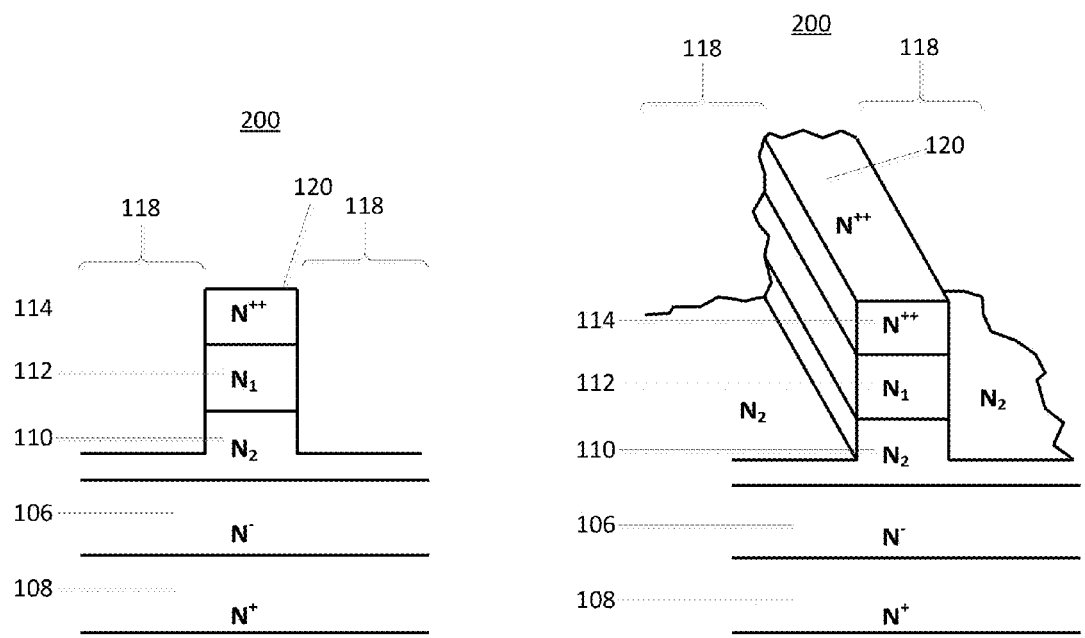
FIG. 2F
FIG. 2G

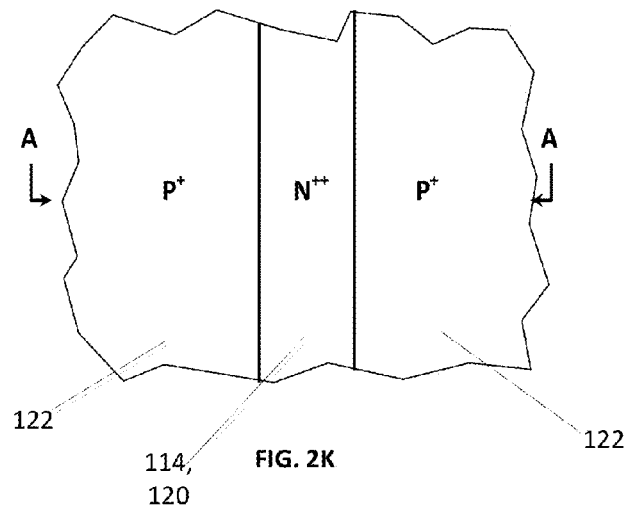
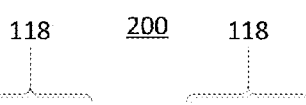
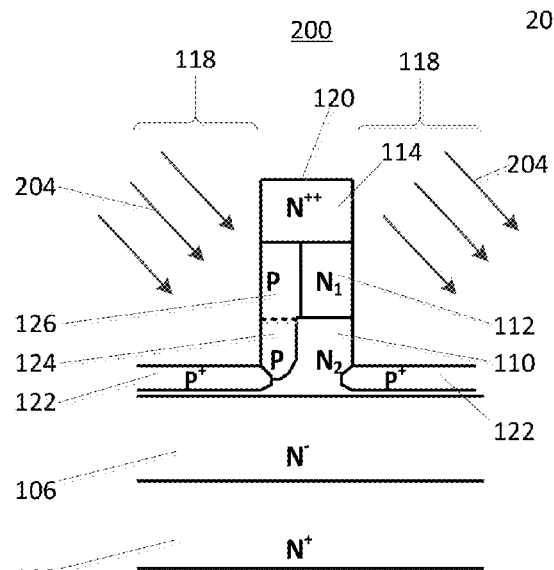
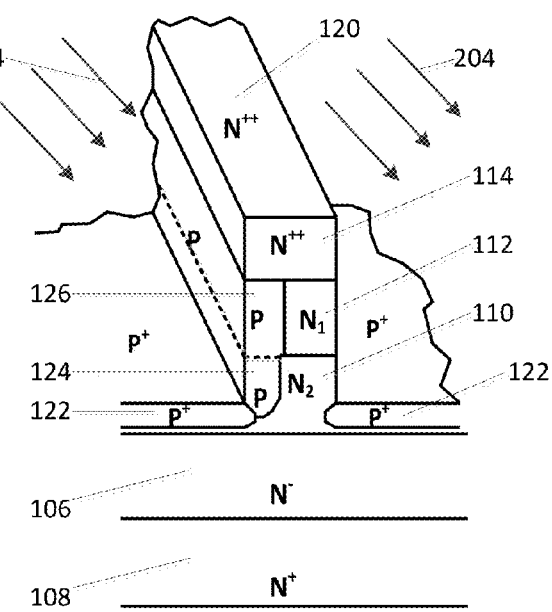
FIG. 2K
FIG. 2L
FIG. 2M

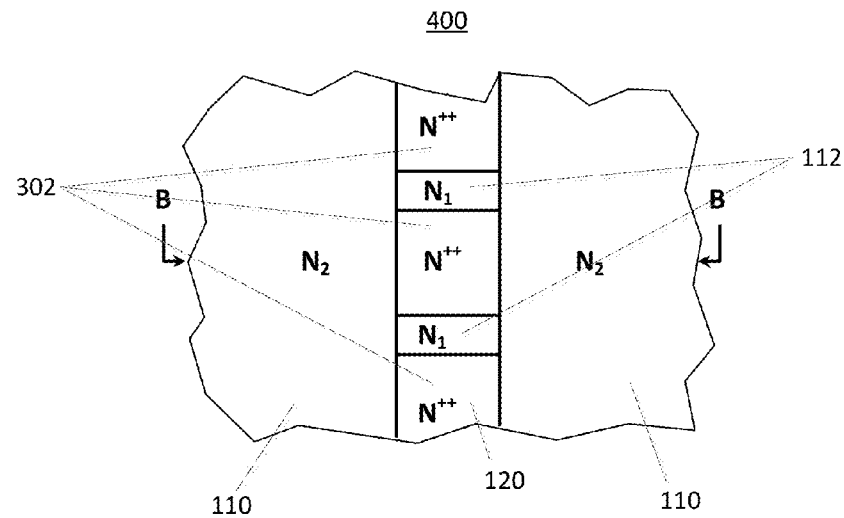
FIG. 4E
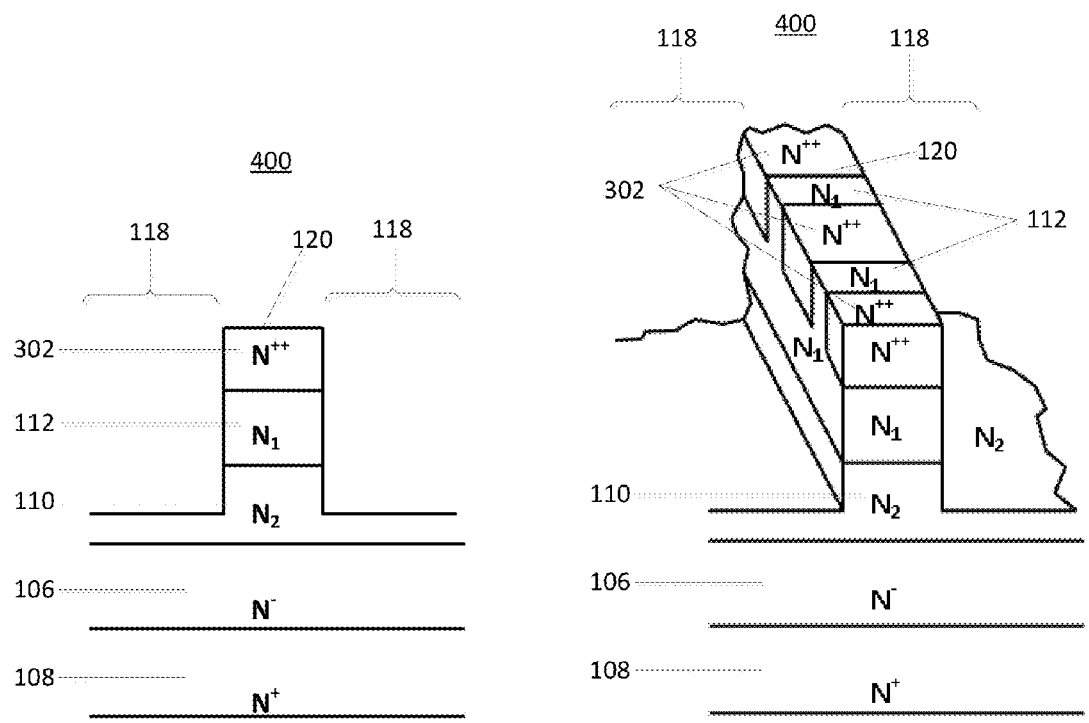
FIG. 4F
FIG. 4G

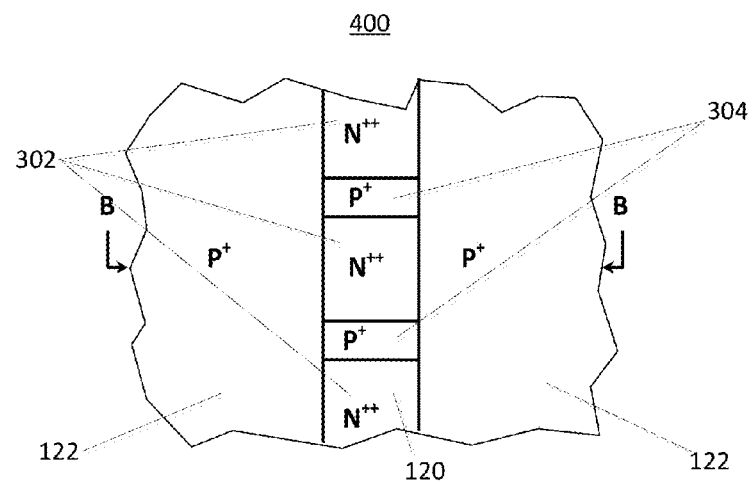
FIG. 4H
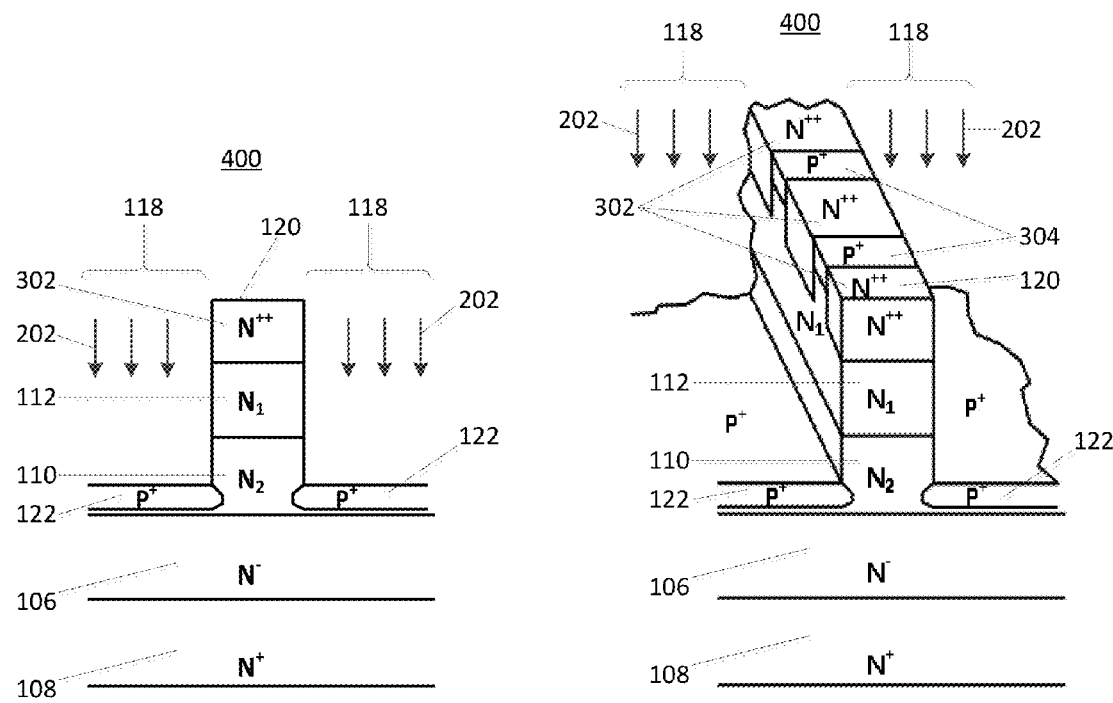
FIG. 4I
FIG. 4J

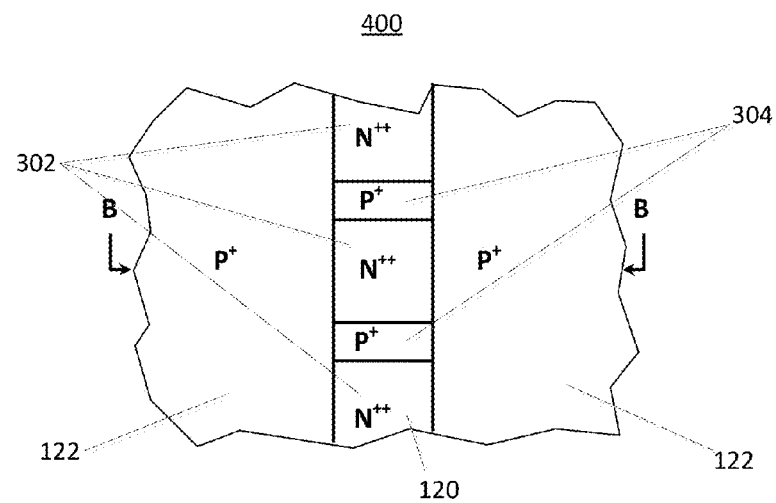
FIG. 4K
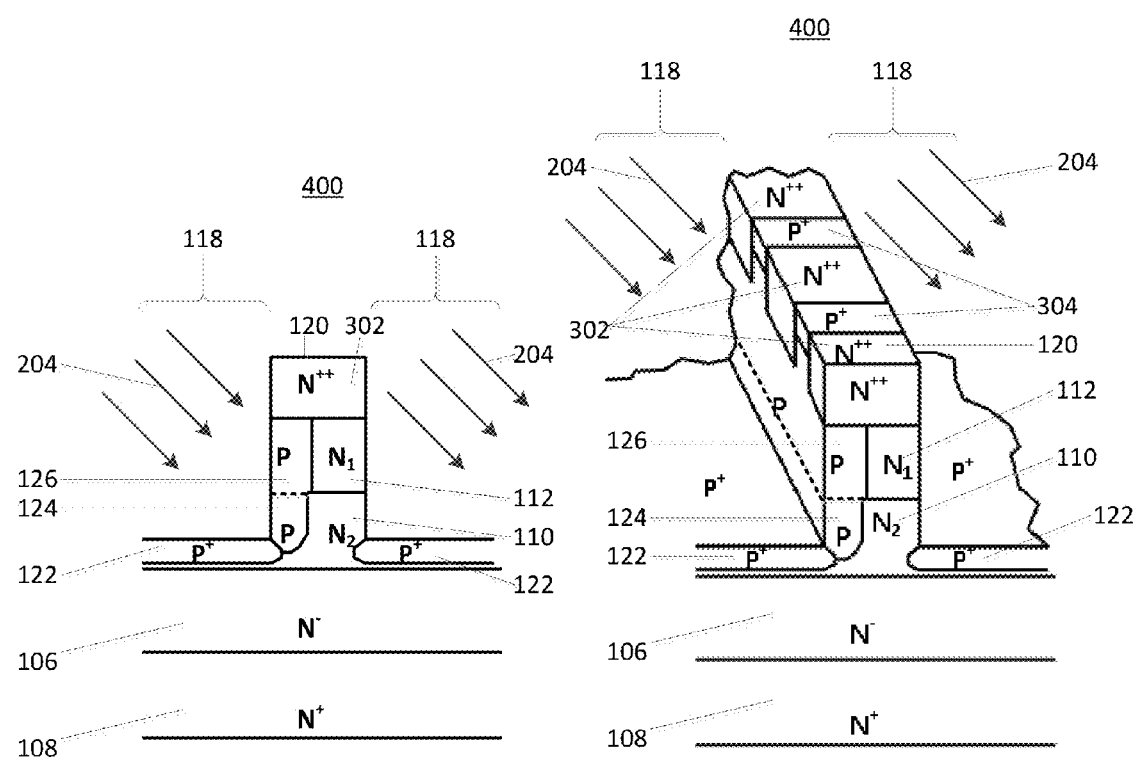
FIG. 4L
FIG. 4M

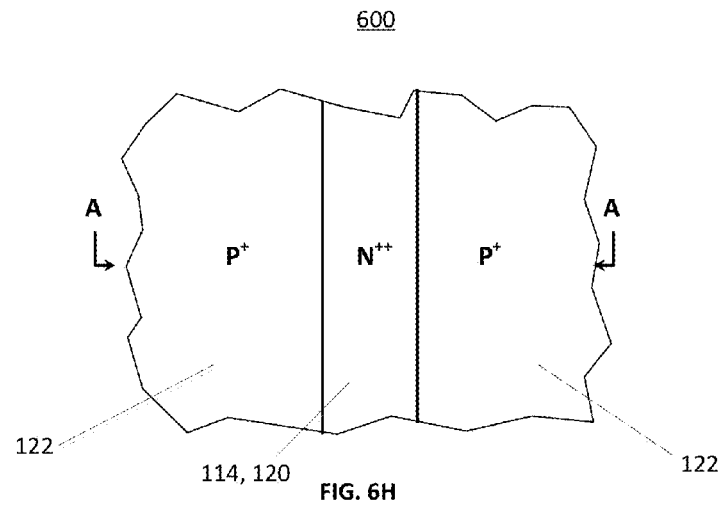
FIG. 6H
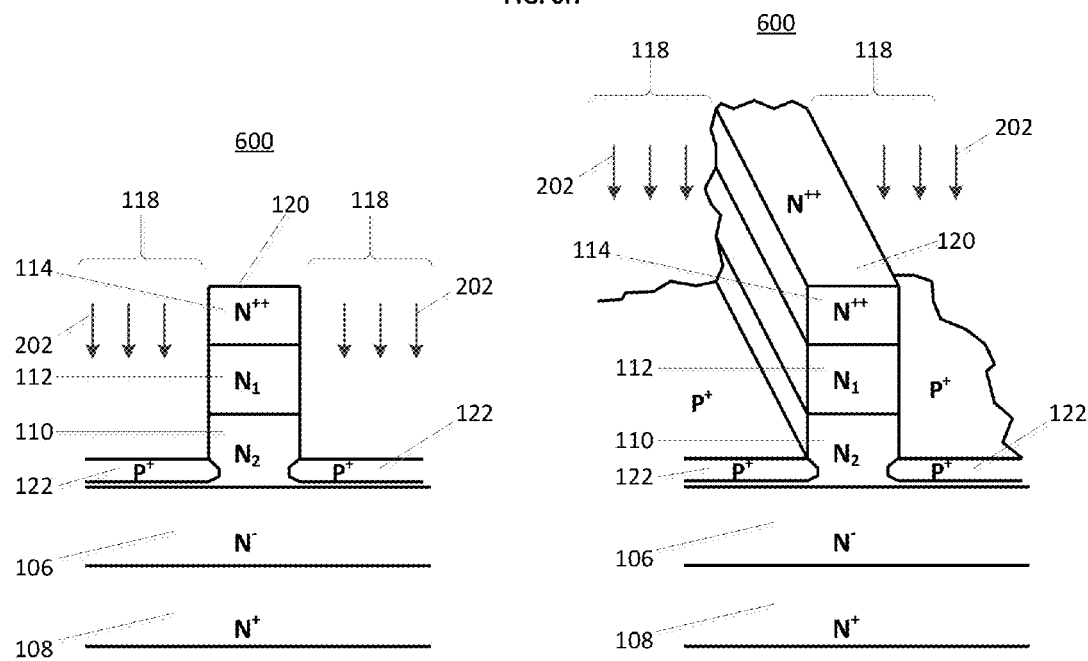
FIG. 6I
FIG. 6J

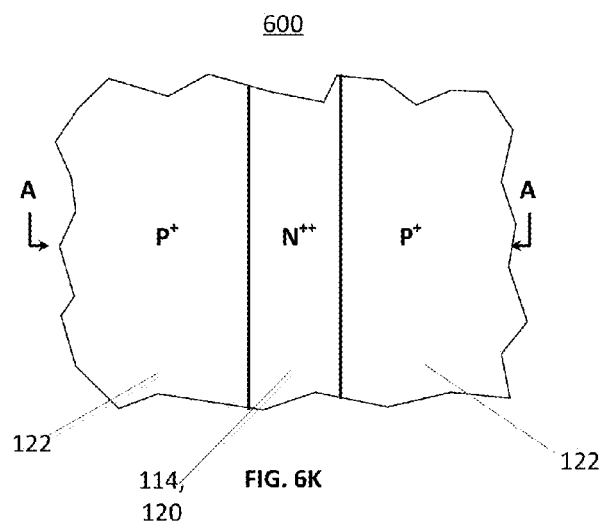
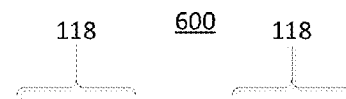
FIG. 6K
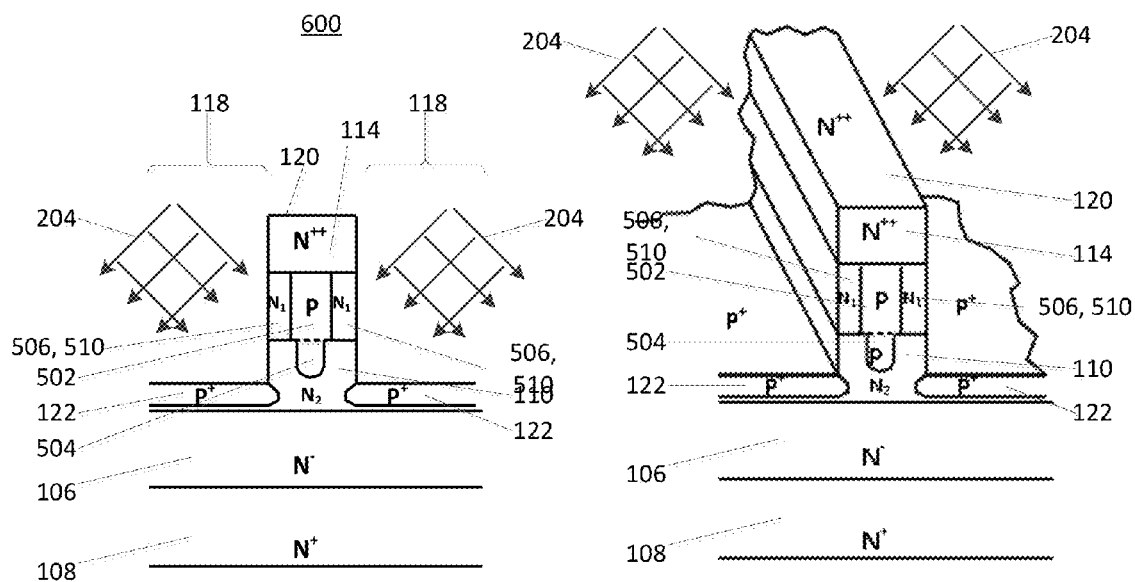
FIG. 6L      FIG. 6M

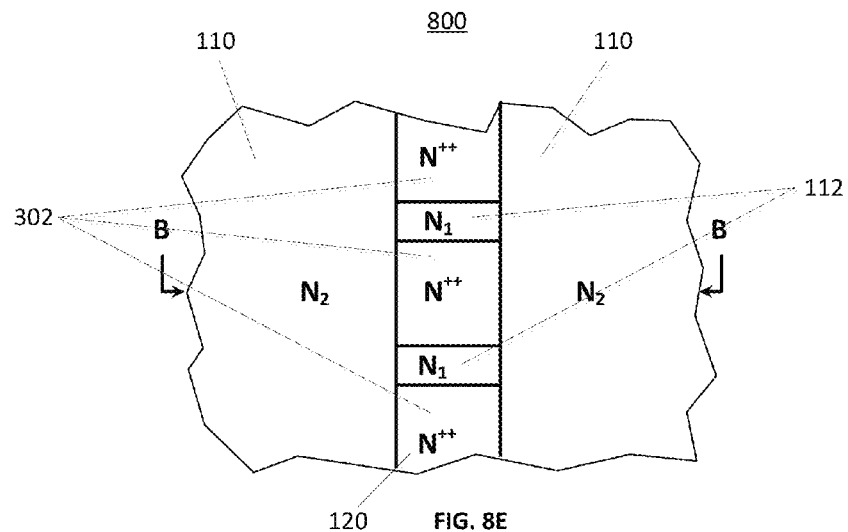
FIG. 8E
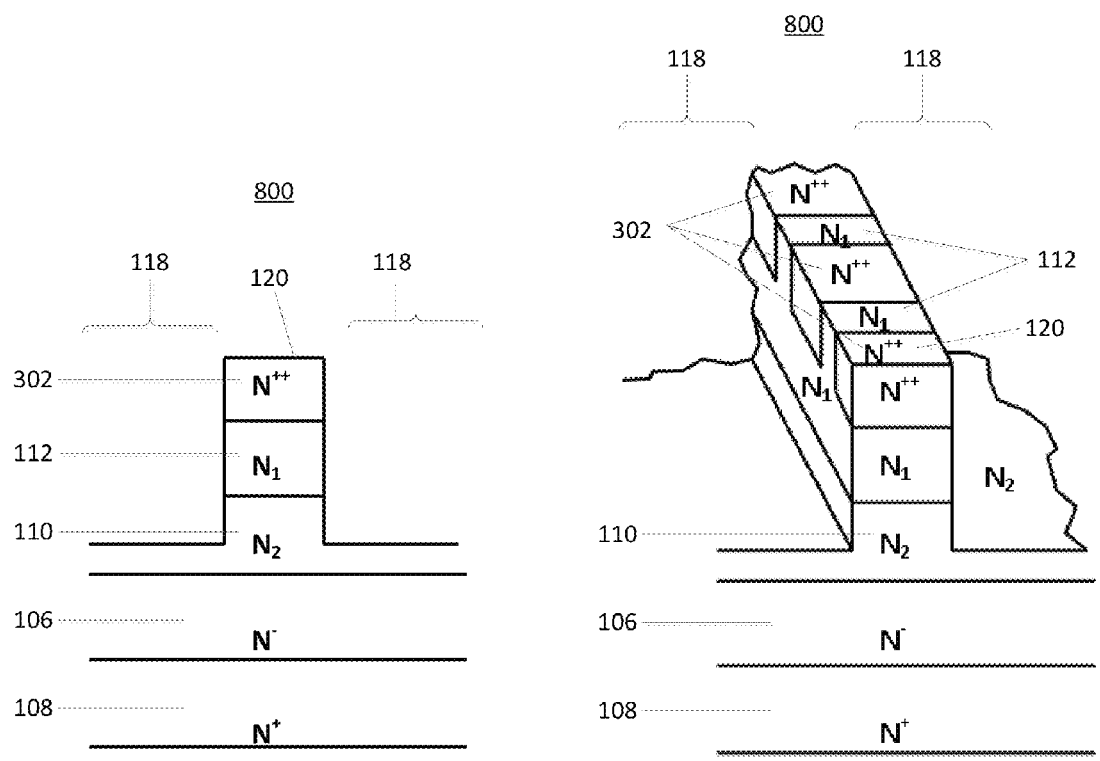
FIG. 8F
FIG. 8G

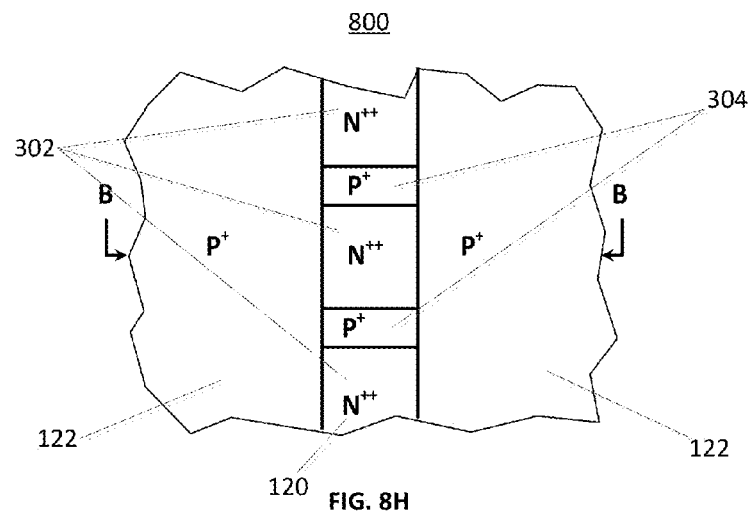
FIG. 8H
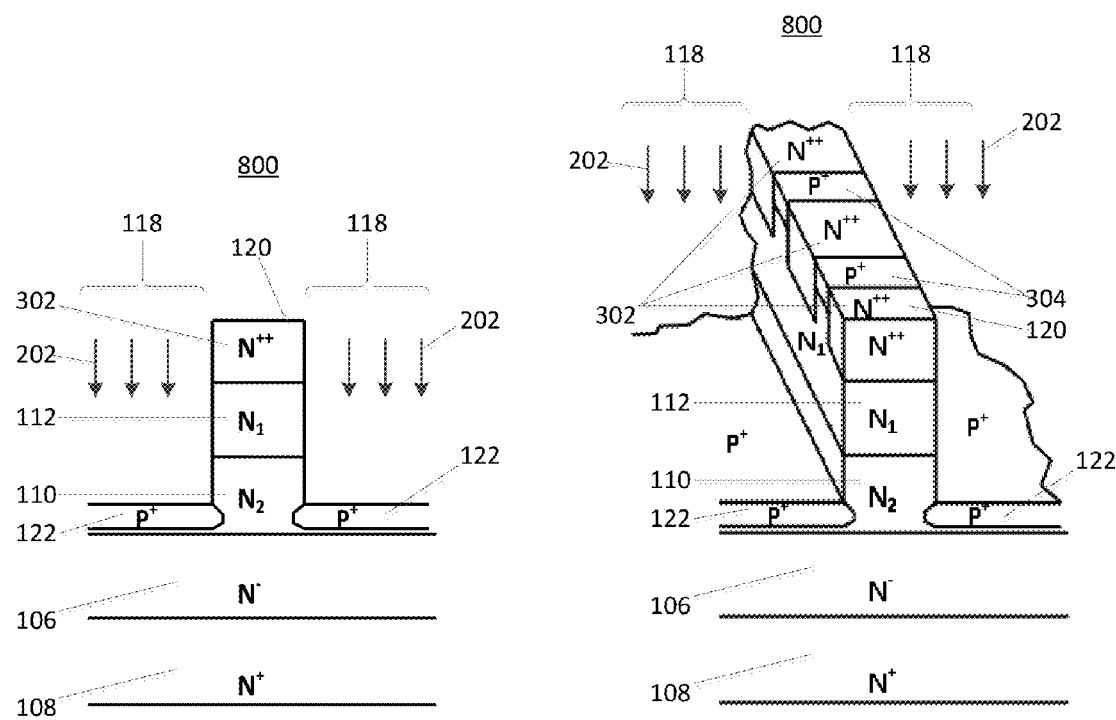
FIG. 8I
FIG. 8J

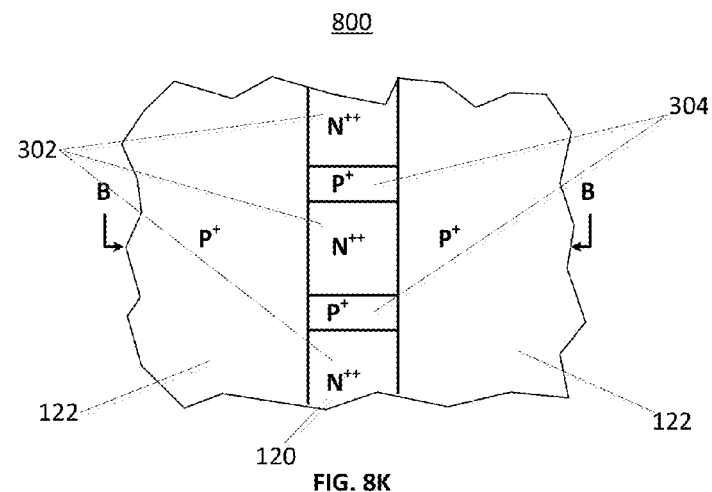
FIG. 8K
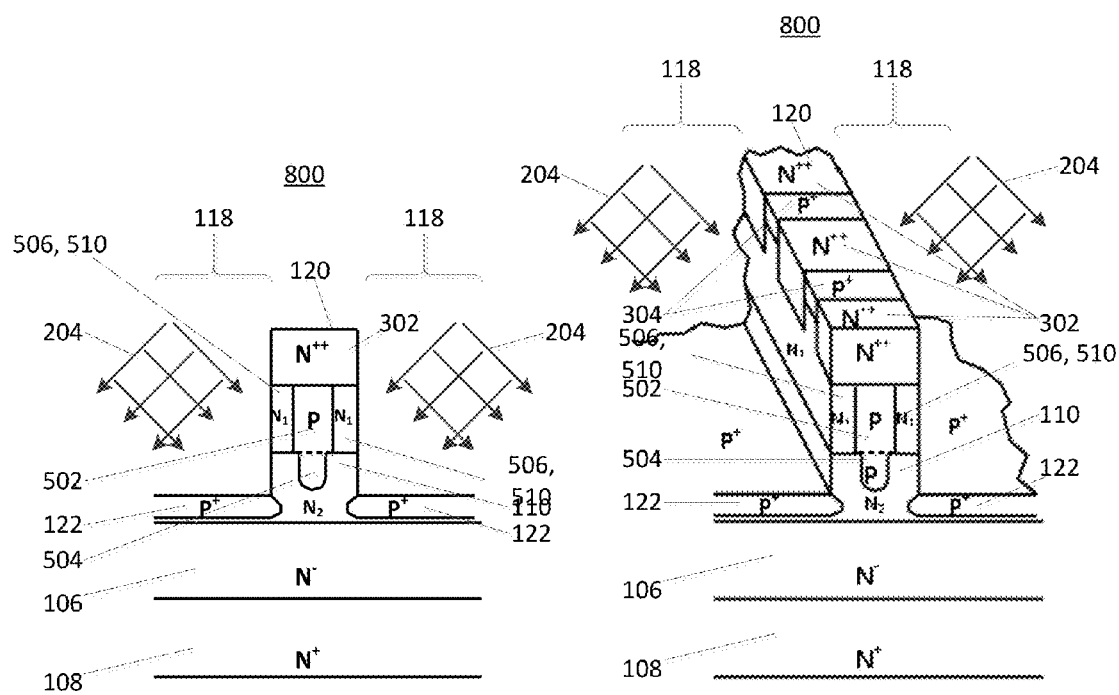
FIG. 8L
FIG. 8M

TRENCHED AND IMPLANTED ACCUMULATION MODE METAL-OXIDE-SEMICONDUCTOR FIELD-EFFECT TRANSISTOR

CROSS REFERENCE TO RELATED APPLICATION

This application claims priority benefit of provisional application Ser. No. 61/671,265, filed Jul. 13, 2012, the entire disclosure of which is incorporated herein by reference for all purposes.

FIELD OF THE INVENTION

The disclosed invention is in the field of SiC metal-oxide-semiconductor field-effect transistors (MOSFETs), such as, for example, a trenched and implanted accumulation mode metal-oxide-semiconductor field-effect transistor (TI-AccuFET) and methods of making the same.

BACKGROUND OF THE INVENTION

Current accumulation mode metal-oxide-semiconductor field-effect transistors (AccuFETs) have several disadvantages which negatively impact their performance characteristics, such as the lack of a p-base region within each accumulation channel and non-uniform accumulation channels. Current AccuFETs may also be manufactured using a self-aligned process and/or require epitaxial regrowth—both of which increase production costs.

Thus, there is a need for an AccuFET with improved performance characteristics and lower production costs. The invention is directed to these and other important needs.

SUMMARY OF THE INVENTION

The present invention provides an accumulation mode metal-oxide-semiconductor field-effect transistor (AccuFET) containing a drain electrode, a lightly doped drift layer of a first conductivity type formed on top of the drain electrode, a current spreading layer of the first conductivity type formed on top of the drift layer, a channel layer of the first conductivity type formed on top of the current spreading layer, a thick, heavily doped source region of the first conductivity type comprised of a first portion of the channel layer adjacent to the top surface of the channel layer, a plurality of U-shaped trenches formed in the current spreading layer and channel layer; the trenches each having a bottom surface, a first side surface, and a second side surface; the trenches extending from the top of the channel layer, through the channel layer, and into the current spreading layer; and the bottom of the trenches being surrounded by the spreading layer, a source electrode formed on top of the source region, a first region of a second conductivity type formed in a first portion of the current spreading layer adjacent to the bottom surfaces of the U-shaped trenches, a second region of the second conductivity type formed in a second portion of the channel layer adjacent to the first side surfaces of the U-shaped trenches, and a third region of the second conductivity type formed in a second portion of the current spreading layer adjacent to the first side surfaces of the U-shaped trenches, the first region of the second conductivity type being formed using tilted ion implantation, an accumulation channel comprised of a third portion of the channel layer of the first conductivity type adjacent to the second side surfaces of the U-shaped trenches, and a gate contact electrically adjacent to the accumulation channel and separated from the accumulation channel by a dielectric layer.

The present invention further provides a self-aligned method of forming an AccuFET including forming a lightly doped drift layer of a first conductivity type on top of a drain electrode, forming a current spreading layer of the first conductivity type on top of the drift layer, forming a channel layer of the first conductivity type on top of the current spreading layer, forming a thick, heavily doped source region of the first conductivity type comprised of a first portion of the channel layer adjacent to the top surface of the channel layer, forming a plurality of U-shaped trenches in the current layer and channel layer through an etching process; the trenches each having a bottom surface, a first side surface, and a second side surface; the trenches extending from the top of the channel layer, through the channel layer, and into the current spreading layer; and the bottom of the trenches being surrounded by the spreading layer, implanting to form a first region of a second conductivity type in a first portion of current spreading layer adjacent to the bottom surface of the U-shaped trenches, the first region of the second conductivity type being formed using vertical ion implantation, implanting to form a second region of the second conductivity type in a second portion of the channel layer and a second portion of the current spreading layer adjacent to the first side surface of the U-shaped trenches, the second region of the second conductivity type being formed using tilted ion implantation, the ion implantation defining the size of an accumulation channel as a function of a width of the second region of the second conductivity type, the accumulation channel comprising a third portion of the channel layer of the first conductivity type adjacent to the second side surface of the U-shaped trenches, forming a source electrode on top of the source region, and forming a gate contact adjacent to the accumulation channel and separated from the accumulation channel by a dielectric layer.

The present invention further provides an AccuFET containing a drain electrode, a lightly doped drift layer of a first conductivity type formed on top of the drain electrode, a current spreading layer of the first conductivity type formed on top of the drift layer, a channel layer of the first conductivity type formed on top of the current spreading layer, a thick, heavily doped source region of the first conductivity type comprised of a first portion of the channel layer adjacent to the top surface of the channel layer, a plurality of U-shaped trenches formed in the current spreading layer and channel layer; the trenches each having a bottom surface, a first side surface, and a second side surface; the trenches extending from the top of the channel layer, through the channel layer, and into the current spreading layer, and the bottom of the trenches being surrounded by the spreading layer, a plurality of mesas defined by the plurality of U-shaped trenches; the mesas having a top surface, a first side surface and a second side surface, the mesas extending from the bottom surface of the U-shaped trenches, through the current spreading layer and the channel layer to the top of the channel layer, source electrodes formed on top of the mesas, a first accumulation channel comprised of a first portion of the current spreading layer and a second portion of the channel layer of the mesas immediately adjacent to the first side surface of the U-shaped trenches, a second accumulation channel comprised of a second portion of the current spreading layer and a third portion of the channel layer of the mesas immediately adjacent to the second side surface of the U-shaped trenches, a first region of a second conductivity type formed in a third portion of the current spreading layer adjacent to the bottom surface of the U-shaped trenches, a second region of the second conductivity type formed in a fourth portion of the current spreading layer and a fourth portion of the channel layer of the mesas, the second region of the second conductivity type being formed using tilted ion implantation, the second region of the second conductivity type being located between the first accumulation channel and the second accumulation channel, and a gate contact adjacent to the accumulation channel and separated from the accumulation channel by a dielectric layer.

The present invention further provides a self-aligned method of forming an AccuFET including forming a lightly doped drift layer of a first conductivity type on top of a drain electrode, forming a current spreading layer of the first conductivity type on top of the drift layer, forming a channel layer of the first conductivity type on top of the current spreading layer, forming a thick, heavily doped source region of the first conductivity type comprised of a first portion of the channel layer adjacent to the top surface of the channel layer, forming a plurality of U-shaped trenches in the current spreading layer and channel layer through an etching process, the trenches having a bottom surface, a first side surface, and a second side surface; the trenches extending from the top of the channel layer, through the channel layer, and into the current spreading layer; and the bottom of the trenches being surrounded by the spreading layer, forming the plurality of U-shaped trenches defining a plurality of mesas, the mesas having a top surface, a first side surface and a second side surface, the mesas extending from the bottom surface of the U-shaped trenches, through the current spreading layer and the channel layer to the top of the channel layer, forming source electrodes on top of the mesas, performing a vertical ion implementation to form a first region of a second conductivity type in the bottom surface of the U-shaped trenches, performing tilted ion implementation to form a second region of the second conductivity type in a second, middle portion of the current spreading layer and channel layer of the mesas, the width of the second region of the second conductivity type in the channel layer defining the width of an accumulation channel, the accumulation channel comprising a third portion of the channel layer of the first conductivity type located on either side of the second portion of the channel layer, and a gate contact adjacent to the accumulation channel and separated from the accumulation channel by a dielectric layer.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any sub combination. Further, reference to values stated in ranges include each and every value within that range.

Figure 1:
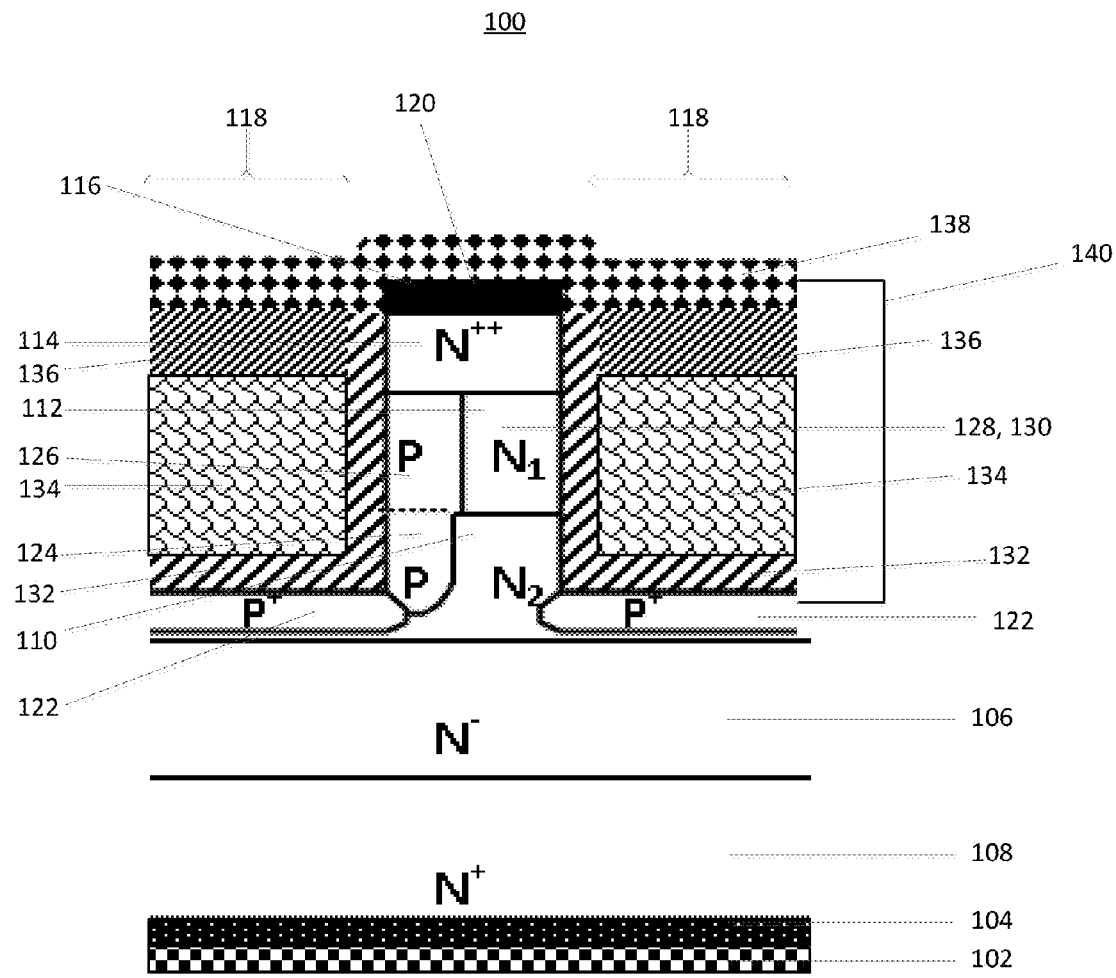
FIG. 1 illustrates an embodiment of the present invention directed to a TI-AccuFET with a single accumulation channel in the side of a mesa.

FIG. 1 illustrates a cross sectional view of an embodiment of the present invention directed to a single accumulation channel TI-AccuFET 100. FIG. 1 illustrates a unit cell of the TI-AccuFET 100. A complete TI-AccuFET 100 is formed by repeating a large number of unit cells in parallel. TI-AccuFET 100, as well as other embodiments of the present invention, contains layers and regions of a first conductivity type and a second conductivity type. For illustrative purposes, the first conductivity type will be referred to as n-type and the second conductivity type will be referred to as p-type, however a person of ordinary skill in the art would understand that this orientation can be reversed.

According to FIG. 1, TI-AccuFET 100 may be comprised of one or more of an n-type lightly doped drift layers 106, n-type current spreading layer 110 and n-type channel layer 112. Additionally, an n-type buffer layer 108 may be formed between the drain electrode 104 and the lightly doped drift layer. Buffer layer 108 may be comprised of 4H—SiC. As depicted in FIG. 1, N-type current spreading layer 110 is formed on top of the lightly doped drift layer 106. N-type channel layer 112 is formed on top of the current spreading layer 110. An n-type thick, heavily doped source region 114 is then formed. As will be explained further below, the thick, heavily doped source region 114 may be formed in at least a portion of the channel layer 112 such that the thick, heavily doped source region 114 is adjacent to the top surface of the channel layer 112. The thick, heavily doped source region 114 may also be formed on top of the channel layer 112. For ease of discussion, the thick, heavily doped source region 114, regardless of how it is formed, is described as being a part of the channel layer 112. A source electrode 116 maybe formed on top of the thick, heavily doped source region 114 and/or the channel layer 112.

One or more U-shaped trenches 118, having two side surfaces and a bottom surface, may be formed in the current spreading layer 110 and channel layer 112. Trenches 118 may extend from the top of the channel layer 112, through the channel layer 112, and into, but not through, the current spreading layer 110 such that the bottom of the trenches 118 may be surrounded by the current spreading layer 110. The U-shaped trenches 118 may form mesas 120 having vertical or near vertical walls. FIG. 1 shows half a U-shaped trench to the left of mesa 120 and a half of another U-shaped trench to the right of mesa 120.

Continuing with the description of FIG. 1, TI-AccuFET 100 may contain several p-type regions. These p-type regions may be located in three portions of TI-AccuFET 100: a first p-type region 122 may be located in a portion of the current spreading layer 110 in the bottom of trenches 118, a second p-type region 124 may be located in a portion of the current spreading layer 110 along one wall of mesa 120 adjacent to one of the side walls of U shaped trenches 118, and a third p-type region 126 may be located in a portion of the channel layer 112 along one wall of mesa 120. In an exemplary embodiment, the first p-type region 122 may have the same doping as regions 124, 126 or a different doping. In FIG. 1, p-type region 122 has a P+ doping while regions 124, 126 have a P doping. The remaining portion 128 of the channel layer 112 (e.g., the portion of the channel layer 112 that excludes the third region 126) borders a second side surface of the U-shaped trenches 118 and may constitute an accumulation channel 130.

Each U-shaped trench 118 may be lined with a gate dielectric layer 132 and then filled with a gate contact 134 and a trench-fill dielectric 136. In such an arrangement, the gate contact 134 may be positioned adjacent to the accumulation channel 130 but separated from accumulation channel 130 by gate dielectric layer 132.

A source electrode may be placed on top of the mesas 120. The mesas 120 and trenches 118 may be covered by source overlay 138. Further, one or more of p-type regions 122, 124, and 126 may be electrically connected to the source overlay 138 within the unit cell of the TI-AccuFET 100 via electrical connector 142. Electrical connector 142 may reduce or eliminate the parasitic intrinsic NPN transistor structure. Additionally, drain electrode 104 may be formed on the bottom surface of the lightly doped drift layer 106 or buffer layer 108 and covered by drain overlay 102.

Figure 2A:
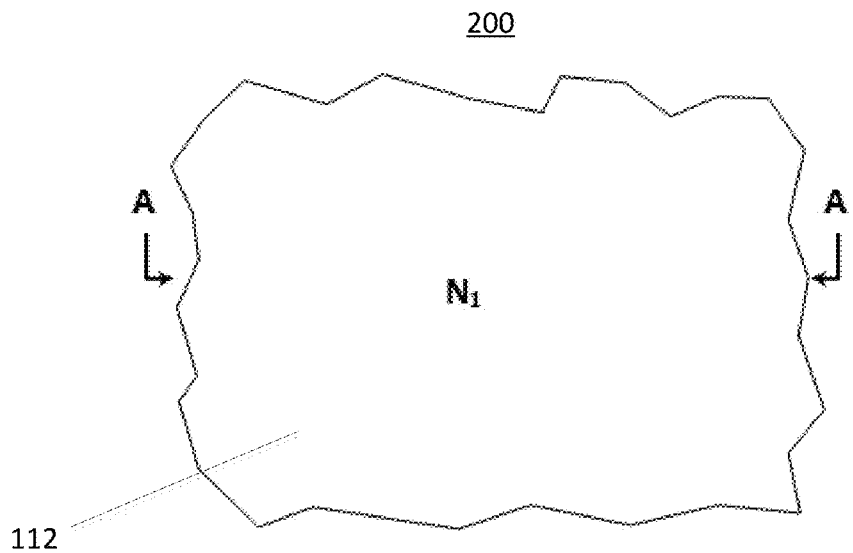
FIGS. 2A-2N illustrate an exemplary method of manufacturing a TI-AccuFET with a single accumulation channel in the side of a mesa.
Figure 2B:
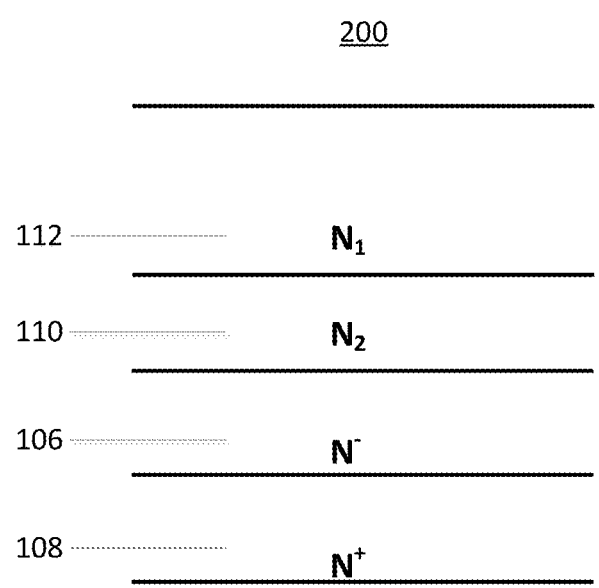
Figure 2C:
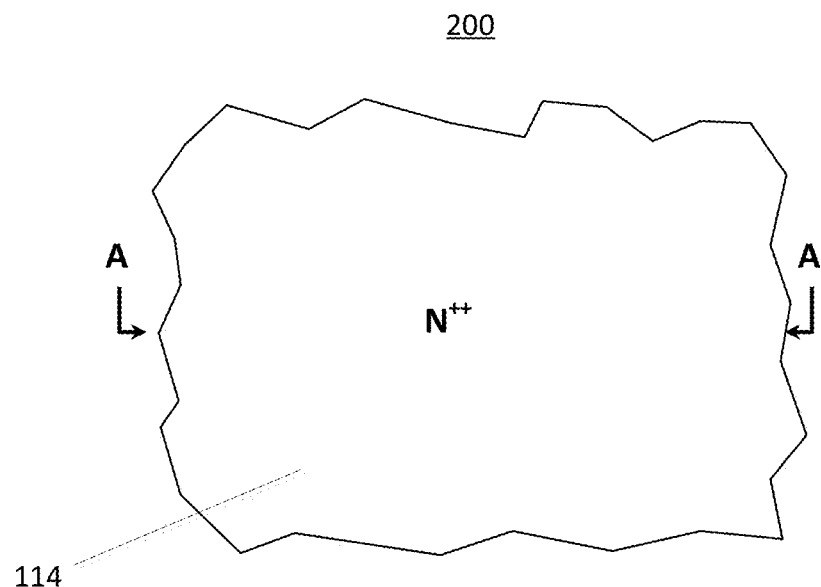
Figure 2D:
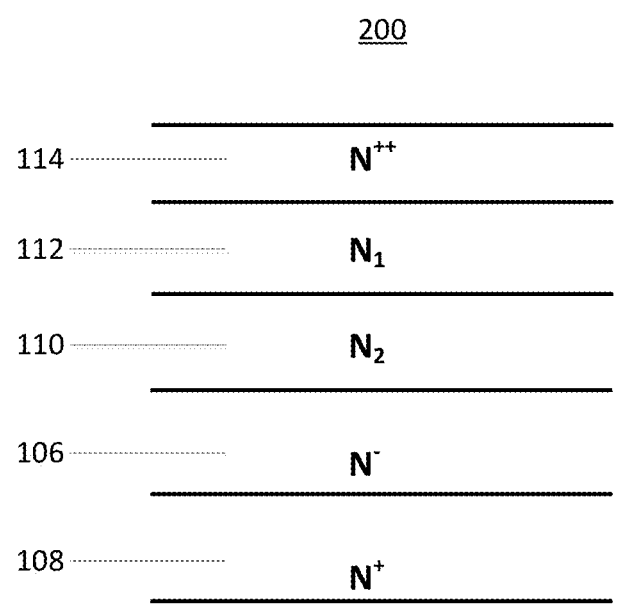
Figure 2H:
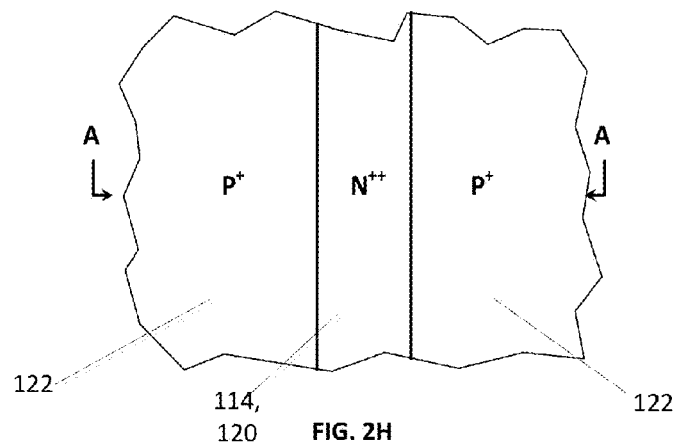
Figure 2I:
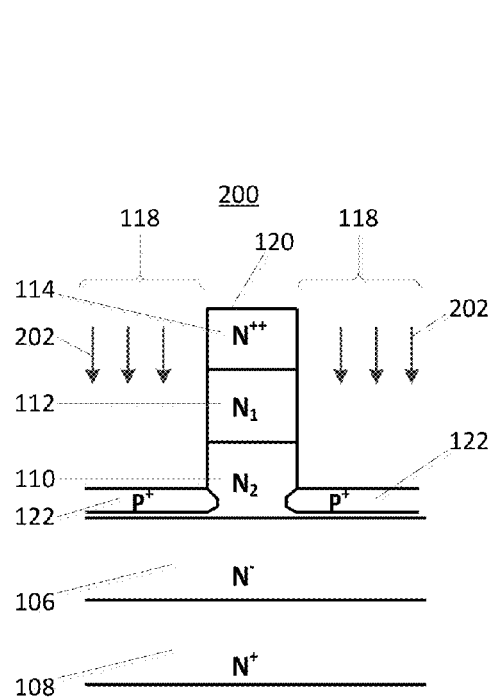
Figure 2J:
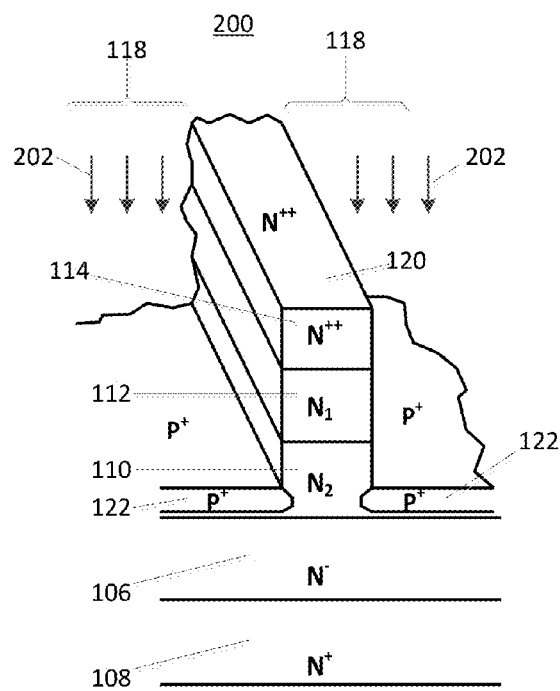
Figure 2N:
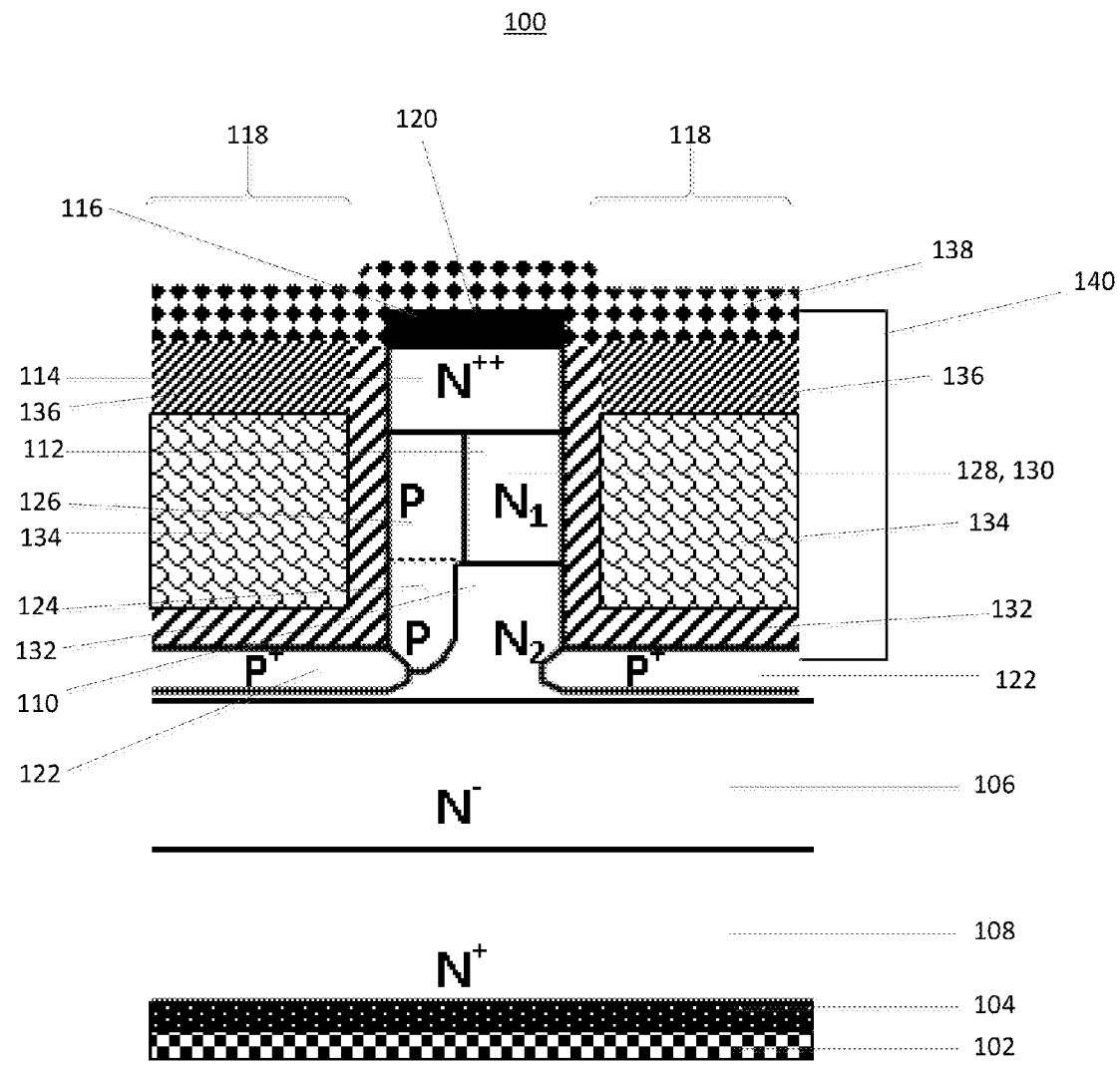

FIGS. 2A-2N illustrate an exemplary method of manufacturing accumulation TI-AccuFET 100 with a single accumulation channel in the side of a mesa.

FIG. 2A illustrates a top view and FIG. 2B illustrates a cross-sectional view of wafer 200 along line A-A. Wafer 200 may be created by forming buffer layer 108, drift layer 106, current spreading layer 110, and channel layer 112 on top of one another, in accordance with those methods known to one skilled in the art, as illustrated in FIGS. 2A and 2B.

FIGS. 2C and 2D illustrate the creation of thick, heavily doped source region 114 in channel layer 112. FIG. 2C is a top view of wafer 200 while FIG. 2D is a cross sectional view along line A-A. Thick, heavily doped source region 114 may be formed on channel layer 112 epitaxially or in the channel layer 112 using those methods known to one skilled in the art. For example, channel layer 112 may be formed using selective or blanket n-type ion implantation. As one of ordinary skill in the art would appreciate, selective ion implantation utilizes an implantation mask to implant n-type ions in select areas of the channel layer 112 whereas blanket n-type ion implantation implants n-type ions over the entire surface of channel layer 112. The doping level of the thick, heavily doped source region 114 may be high enough to prevent the thick, heavily doped source region 114 from being converted to a p-type region by subsequent p-type ion implantation(s).

FIGS. 2E, 2F and 2G illustrate the creation of U-shaped trenches 118 and mesas 120 in wafer 200. FIG. 2E is a top view, FIG. 2F is a cross sectional view along line A-A, and FIG. 2G is a 3D cross sectional view along line A-A of wafer 200. U-shaped trenches 118 are formed using those methods known to one skilled in the art such as, for example, plasma etching and an etching mask.

FIGS. 2H, 2I, and 2J illustrate forming the first p-type region 122 in the bottom of trenches 118. FIG. 2H is a top view, FIG. 2I is a cross sectional view along line A-A, and FIG. 2J is a 3D cross sectional view along line A-A of wafer 200. Arrows 202 illustrate the direction of vertical implantation (e.g., implantation under normal incidence with respect to the original wafer 200 surface) of ions of the second conductivity type (e.g., p-type ions), in this case P+ ions. Implanting a sufficient amount of p-type ions, using vertical implantation, in the section of the current spreading layer 110 at the bottom of trench 118 may create the first p-type region 122. The doping concentration of p-type ions in the first p-type region 122 and the depth of the first p-type region 122 may be a function of the doping concentration of p-type ions used during vertical implantation and/or the duration of vertical ion implantation. Further, the doping concentration and depth of p-type region 122 may be selected to achieve a specific device blocking voltage for the resulting TI-AccuFET. As illustrated in FIGS. 2H-2J, part of the first p-type region 122 may extend past the side surfaces of the u-shaped trenches 118 towards the center of the mesas 120.

In contrast to current spreading layer 110, thick, heavily doped source region 114 may have an n-type doping high enough to prevent a p-type region from forming (e.g., no part of the thick, heavily doped source region 114 is not converted to a p-type region) when exposed to vertical implantation. However, as a result of vertical implantation, thick, heavily doped source region 114 may have some p-type impurities. P-type impurities in the thick, heavily doped source region 114 may arise where, for example, an implantation mask is not used during vertical and/or tilted implantation (e.g., where a self-aligned manufacturing process is utilized).

FIGS. 2K, 2L, and 2M illustrate forming the second p-type region 124 and the third p-type region 126 in the current spreading layer 110 and channel layer 112, respectively. FIG. 2K is a top view, FIG. 2L is a cross sectional view along line A-A, and FIG. 2M is a 3D cross sectional view along line A-A of wafer 200. Arrows 204 illustrate the direction of tilted implantation (e.g., implantation under non-vertical or not-normal incidence with respect to the original wafer 200 surface) of ions of the second conductivity type (e.g., p-type ions), in this case P ions, into a side wall of mesas 120. Tilted implantation may be achieved by, for example, mounting wafer 200 at an angle relative to the direction of ion implantation.

As with vertical implantation, implanting a sufficient amount of p-type ions, using tilted implantation, a side wall of the mesa 120 may create the second p-type region 124 and the third p-type region 126. The doping concentration of p-type ions and the width of the second p-type region 124 and the third p-type region 126 may be determined by several factors, such as the concentration of p-type ions and/or the duration of tilted ion implantation. The width of the second p-type region 124 and the third p-type region 126 may also be influenced by the level of n-type doping of channel layer 112 and current spreading layer 110 (with a p-type region being more easily implanted in a lightly doped n-type layer as compared to a more heavily doped n-type layer). Additionally, the width of the width of the second p-type region 124 and the third p-type region 126 may vary as neighboring mesas 120 may partially block ions from being vertically implanted into current spreading layer 110, causing the current spreading layer 110 to receive fewer p-type ions than channel layer 112. In an exemplary embodiment, the above factors may be used to create an accumulation channel 130 and/or third p-type region 126 with a specific doping concentration and/or uniform width. For example, the width of the second p-type region 124 and the third p-type region 126 may determine the width of the accumulation channel 130.

In contrast to current spreading layer 110 and channel layer 112, thick, heavily doped source region 114 may have an n-type doping high enough to prevent a p-type region from forming when exposed to tilted implantation. However, as a result of tilted ion implantation and/or vertical ion implantation, thick, heavily doped source region 114 may have some p-type impurities. P-type impurities in the thick, heavily doped source region 114 may arise where, for example, an implantation mask is not used during tilted and/or vertical implantation (e.g., where a self-aligned manufacturing process is utilized). As the thick, heavily doped source region 114 may be exposed to both vertical and tilted ion implantation, the thick, heavily doped source region 114 may have a p-type impurity concentration that is greater than the p-type impurity of the accumulation channel 130 and the p-type concentration of the first p-type region 122. Further, while the accumulation channel 130 may have some p-type impurities as a result of the tilted ion implantation, the p-type impurity concentration may be less than the p-type concentration of the first p-type region 122.

FIG. 2N illustrates forming drain overlay 102, drain electrode 104, source electrode 140, the gate dielectric layer 132, gate contact 134, trench-fill dielectric 136, and source overlay 138 on wafer 200, resulting in TI-AccuFET 100. Source electrode 140 and drain electrode 104 may be low resistivity contacts. Further, one or more of the p-type regions 122, 124, and 126 may be electrically connected to the source overlay 138 within the unit cell of the TI-AccuFET 100 via electrical connector 142.

Figure 3:
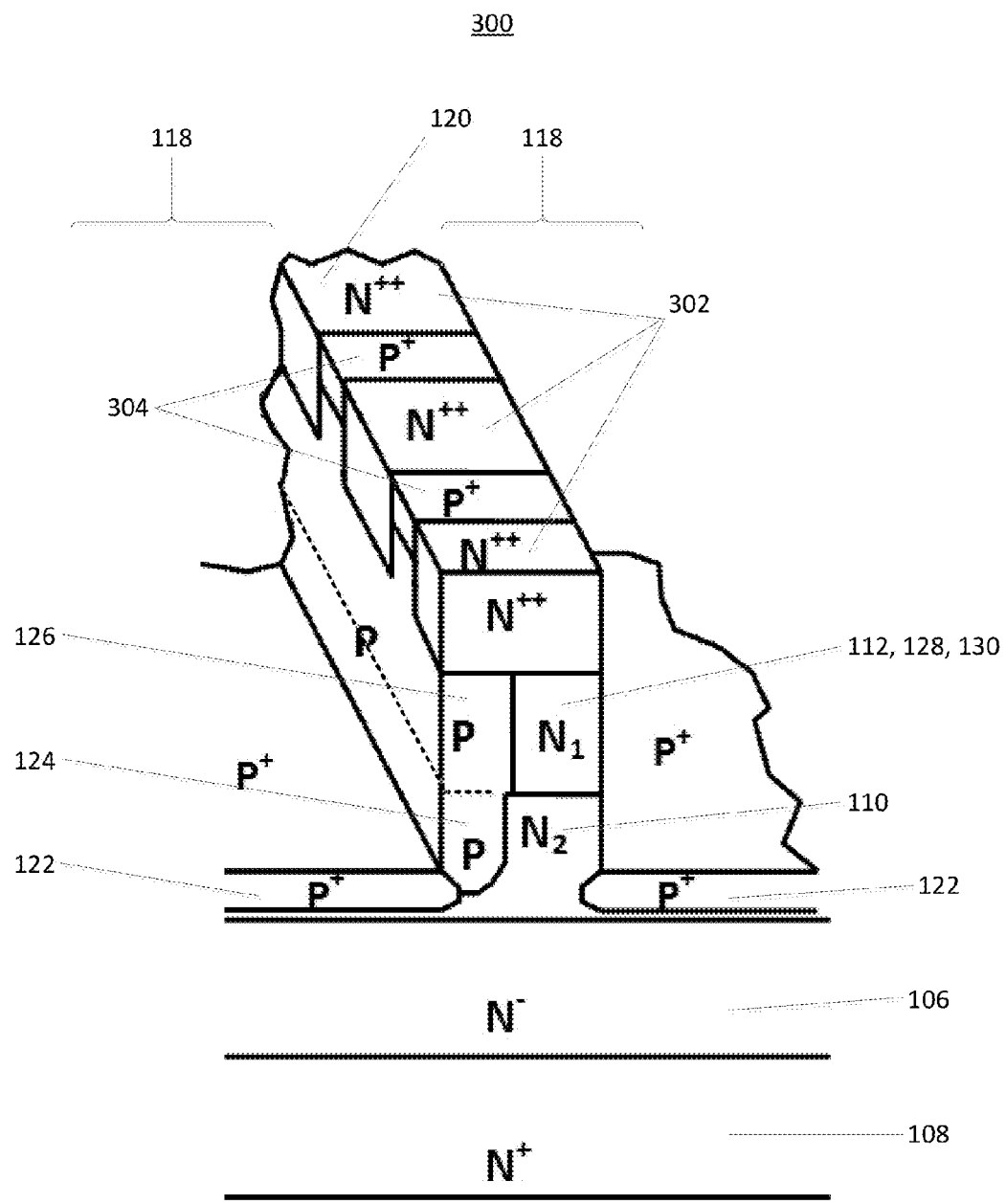
FIG. 3 illustrates a cross sectional view of another exemplary embodiment of a single accumulation channel TI-AccuFET.

FIG. 3 illustrates a cross sectional view of an exemplary embodiment of a single accumulation channel TI-AccuFET 300 in accordance with the present invention. FIG. 1 illustrates to a unit cell of the TI-AccuFET 300 and a complete TI-AccuFET 300 is formed by repeating a large number of unit cells in parallel. TI-AccuFET 300 contains elements that are similar to those of TI-AccuFET 100 such as drain overlay 102, drain electrode 104, lightly doped drift layer 106, buffer layer 108, current spreading layer 110, channel layer 112, source electrode 116, u-shaped trenches 118, mesas 120, first p-type region 122, accumulation channel 130, gate dielectric layer 132, gate contact 134, trench-fill dielectric 136, source overlay 138, source electrode and electrical connection 142 (for clarity, source electrode 116, gate dielectric layer 132, gate contact 134, trench-fill dielectric 136, source electrode 140 and source overlay 138 are not shown in FIG. 3). TI-AccuFET 300 may further contain one or more n-type thick, heavily doped source regions 302 and one or more fourth p-type regions 304 in the channel layer 112. As will be explained further below in connection with FIGS. 4A-4N and is illustrated in FIG. 3, the thick, heavily doped source region 302 and the fourth p-type region 304 may be formed in at least a portion of the channel layer 112 such that they are adjacent to the top surface of the channel layer. As TI-AccuFET 300 has region of both conductivity types along the top surface of the channel layer 112, electrical connector 142 is not required.

Figure 4A:
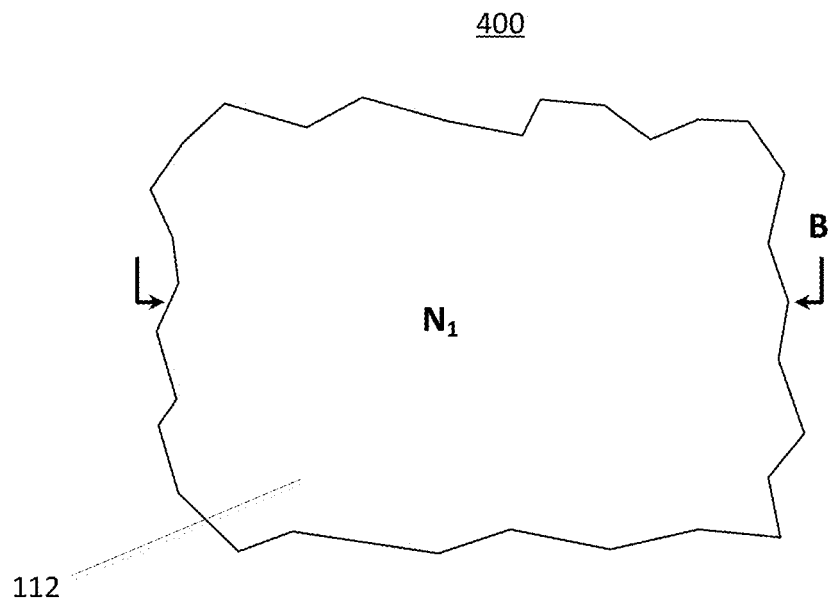
FIGS. 4A-4N illustrate another exemplary method of manufacturing a TI-AccuFET with a single accumulation channel in the side of a mesa.
Figure 4B:
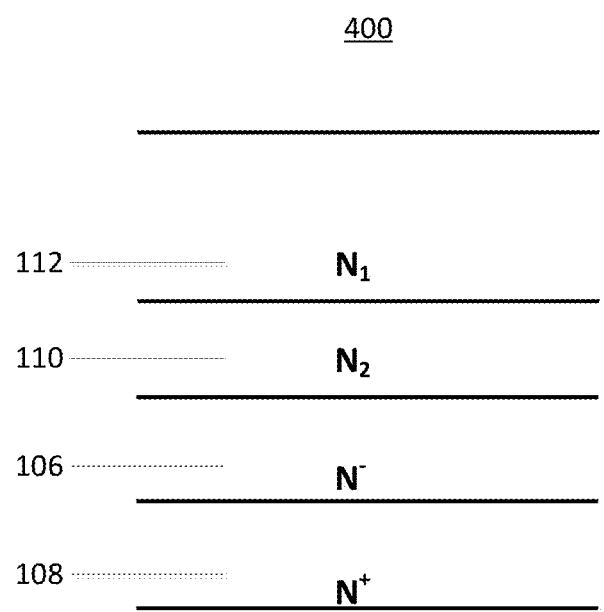
Figure 4C:
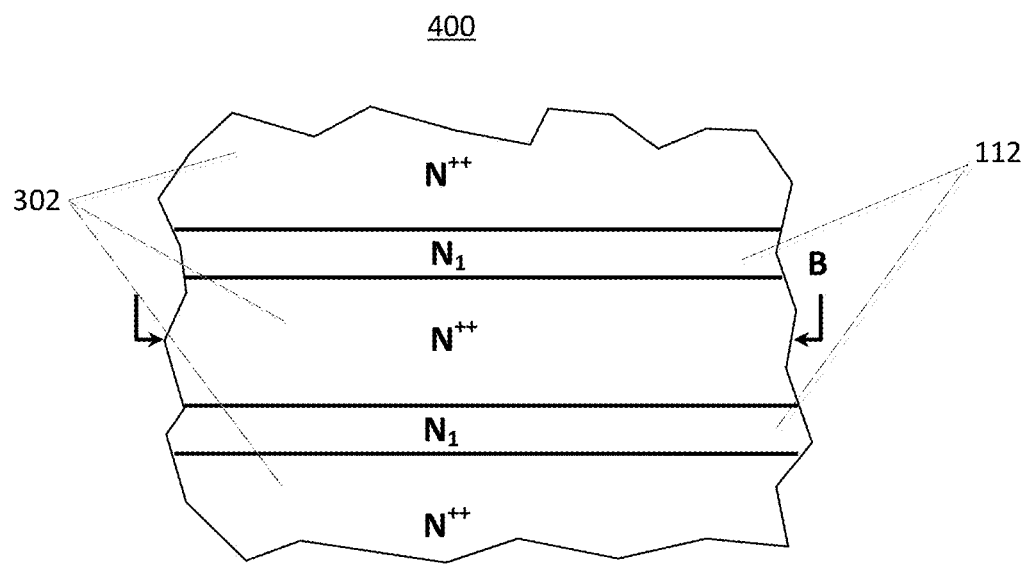
Figure 4D:
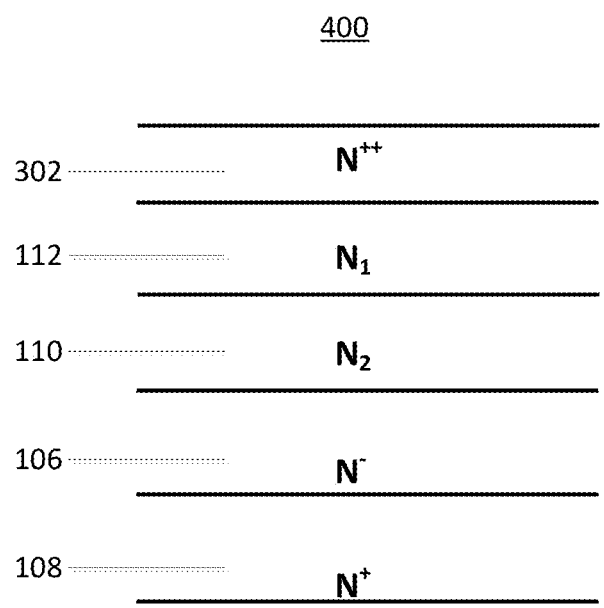
Figure 4N:
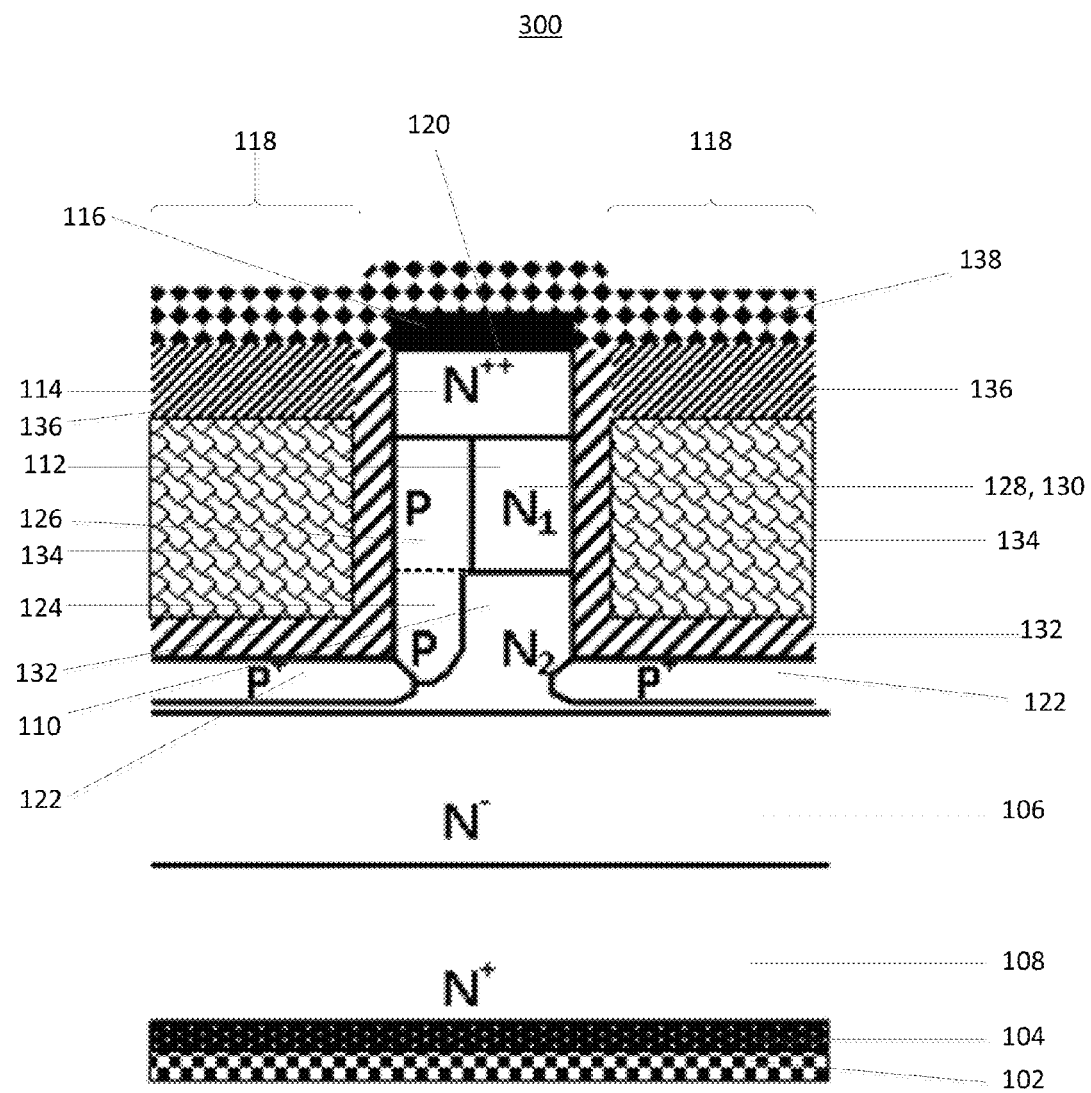

FIGS. 4A-4N illustrate an exemplary method of manufacturing TI-AccuFET 300 with a single accumulation channel in the side of a mesa 120.

FIG. 4A illustrates a top view and FIG. 4B illustrates a cross-sectional view of wafer 400 along line B-B. Wafer 400 may be created in a manner similar to that of wafer 200, as discussed above in connection with FIG. 2A.

FIGS. 4C and 4D illustrate the creation of thick, heavily doped source regions 302 in channel layer 112. FIG. 4C is a top view of wafer 400 while FIG. 4D is a cross sectional view of wafer 400 along line B-B. One or more thick, heavily doped source regions 302 may be formed on channel layer 112 in a manner that covers less than the entire top surface of channel layer 112, as illustrated in FIG. 4C. For example, the thick, heavily doped source regions 302 may be strips formed using those methods of selective ion implantation known to one skilled in the art.

FIGS. 4E, 4F and 4G illustrate the creation of U-shaped trenches 118 and mesas 120 in wafer 400. FIG. 4E is a top view, FIG. 4F is a cross sectional view along line B-B, and FIG. 4G is a 3D cross sectional view along line B-B of wafer 400. U-shaped trenches 118 may be created in a manner similar to those of wafer 200, as discussed above in connection with FIGS. 2E, 2F, and 2G.

FIGS. 4H, 4I, and 4J illustrate forming the first p-type region 122 in the bottom of trenches 118 and fourth p-type region(s) 304 on the top of channel layer 112. FIG. 4H is a top view, FIG. 4I is a cross sectional view along line B-B, and FIG. 4J is a 3D cross sectional view along line B-B of wafer 400. Similar to FIGS. 2H-2J, and the above description thereof, arrows 202 illustrate the direction of vertical implantation of ions of the second conductivity type (e.g., p-type ions), in this case P+ ions. As with first p-type region 122, implanting a sufficient amount of p-type ions, using vertical implantation, in the section of channel layer 112 adjacent to the stop surface of the channel layer 112 may create the fourth p-type region(s) 304. The doping concentration of p-type ions and the depth of the fourth p-type region(s) 304 may be a function of the doping concentration of p-type ions and/or the duration of vertical ion implantation. Further, as illustrated in FIGS. 4H-4J, fourth p-type region(s) 304 may be interspersed between thick, heavily doped source regions 302 along the top surface of the channel layer 112.

FIGS. 4K, 4L, and 4M illustrate forming the second p-type region 124 and the third p-type region 126 in the current spreading layer 110 and channel layer 112, respectively. FIG. 4K is a top view, FIG. 4L is a cross sectional view along line B-B, and FIG. 4M is a 3D cross sectional view along line B-B of wafer 400. Second p-type region 124, third p-type region 126, and accumulation channel 130 may be formed in a manner similar to those of wafer 200, as discussed above in connection with FIGS. 2K, 2L, and 2M.

Similar to wafer 200, as discussed above in connection with FIGS. 2C and 2D, the doping level of the thick, heavily doped source regions 302 may be high enough to prevent the thick, heavily doped source region 302 from being converted to a p-type region by subsequent p-type ion implantation(s). However, as a result of tilted ion implantation and/or vertical ion implantation, thick, heavily doped source region 302 may have some p-type impurities. P-type impurities in the thick, heavily doped source region 302 may arise where, for example, an implantation mask is not used during vertical and/or tilted implantation (e.g., where a self-aligned manufacturing process is utilized).

FIG. 4N illustrates forming drain overlay 102, drain electrode 104, source electrode 140, the gate dielectric layer 132, gate contact 134, trench-fill dielectric 136, and source overlay 138 on wafer 400, which results in TI-AccuFET 300. Source electrode 140 and drain electrode 104 may be low resistivity contacts.

Figure 5:
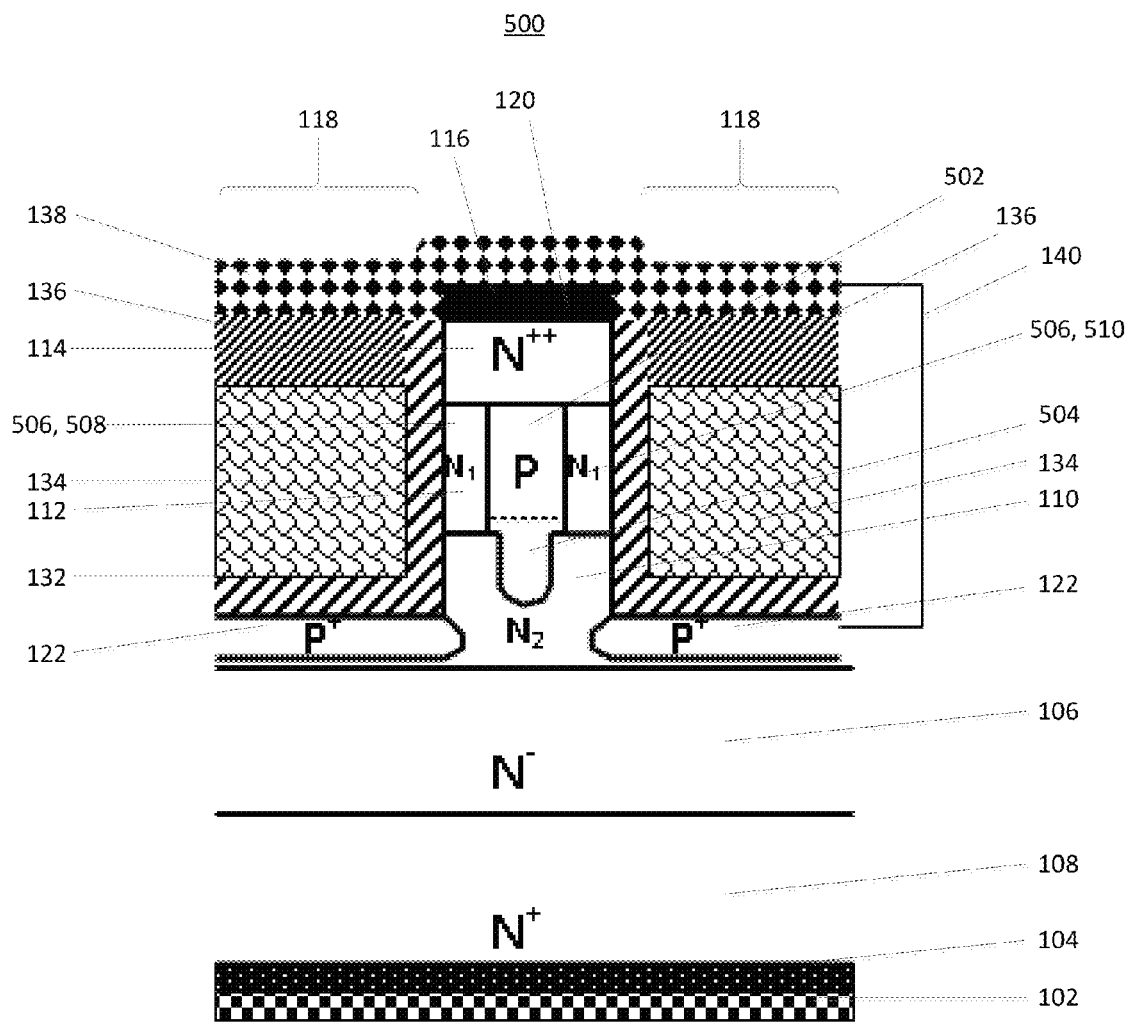
FIG. 5 illustrates a cross sectional view of an exemplary dual accumulation channel TI-AccuFET.

FIG. 5 illustrates a cross sectional view of a dual accumulation channel TI-AccuFET 500 in accordance with another embodiment of the present invention. FIG. 5 illustrates to a unit cell of the TI-AccuFET 500 and a complete TI-AccuFET 500 is formed by repeating a large number of unit cells in parallel. TI-AccuFET 500 contains several elements that are similar to those of TI-AccuFET 100, such as drain overlay 102, drain electrode 104, lightly doped drift layer 106, buffer layer 108, current spreading layer 110, channel layer 112, thick, heavily doped source region 114, source electrode 116, u-shaped trenches 118, mesas 120, first p-type region 122, gate dielectric layer 132, gate contact 134, trench-fill dielectric 136, source overlay 138, source electrode and electrical connection 142. TI-AccuFET 500 may further contain a second p-type region 502 and a third p-type region 504 which may have the same or different doping than first p-type region 122. The remaining portion 506 of the channel layer (e.g., the portion of the channel layer 112 that excludes the second p-type region 502) borders the first and second side surfaces of the u-shaped trenches 118 and may constitute the accumulation channels 508, 510.

Figure 6A:
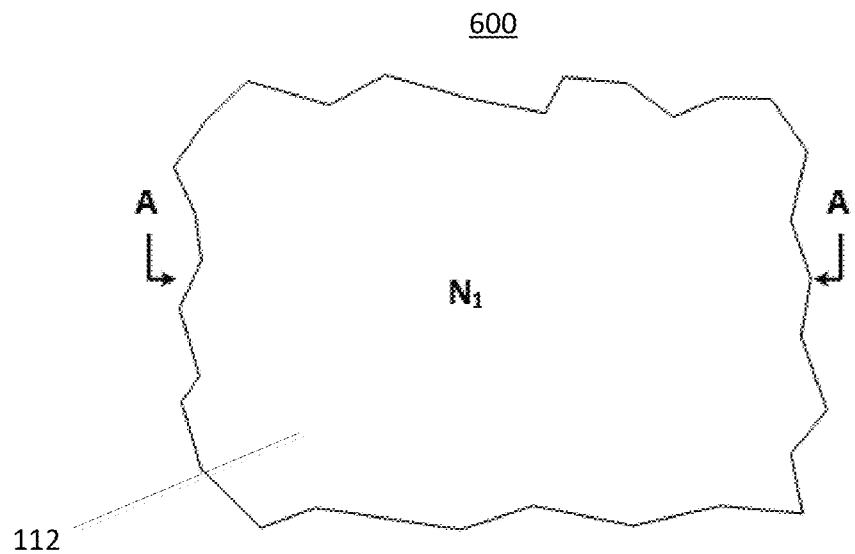
FIGS. 6A-6N illustrate an exemplary method of manufacturing a dual accumulation channel TI-AccuFET.
Figure 6B:
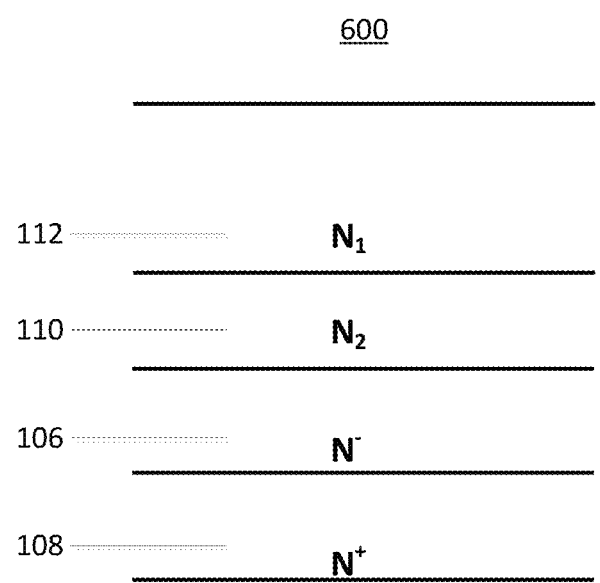
Figure 6C:
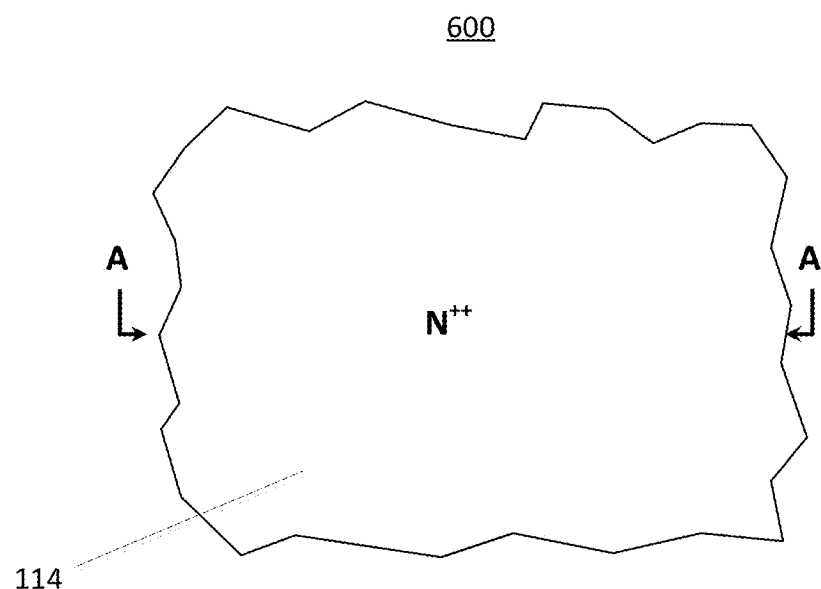
Figure 6D:
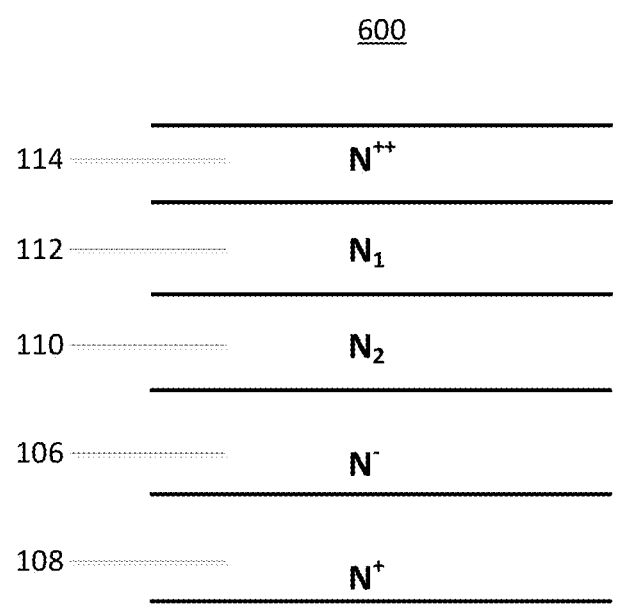
Figure 6E:
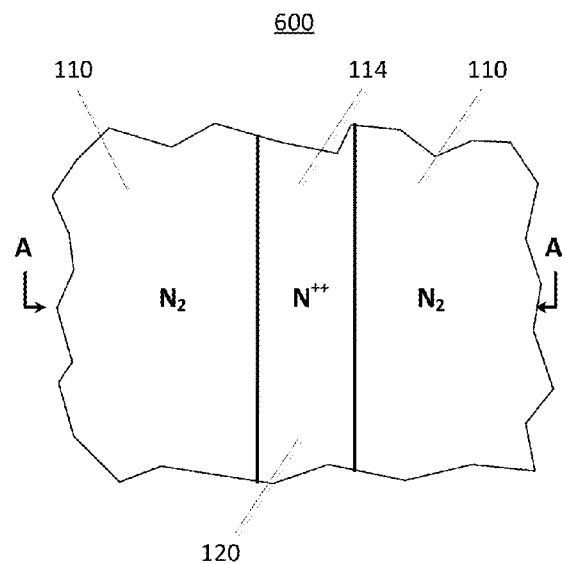
Figure 6F:
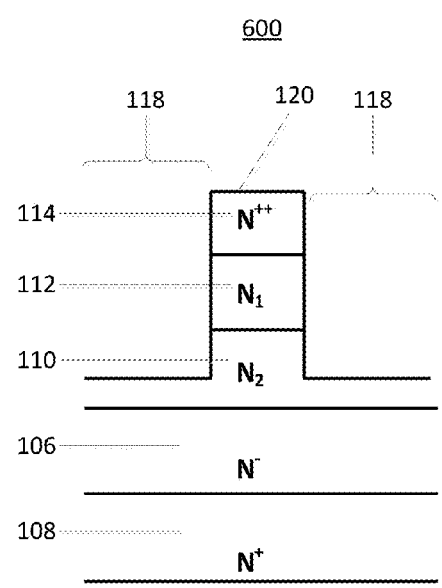
Figure 6G:
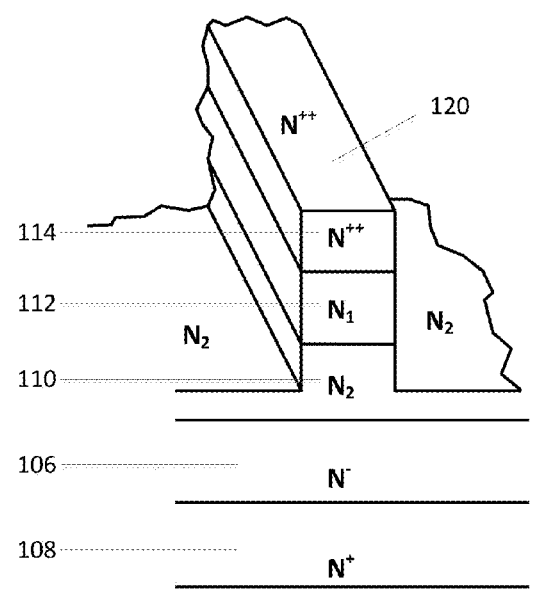
Figure 6N:
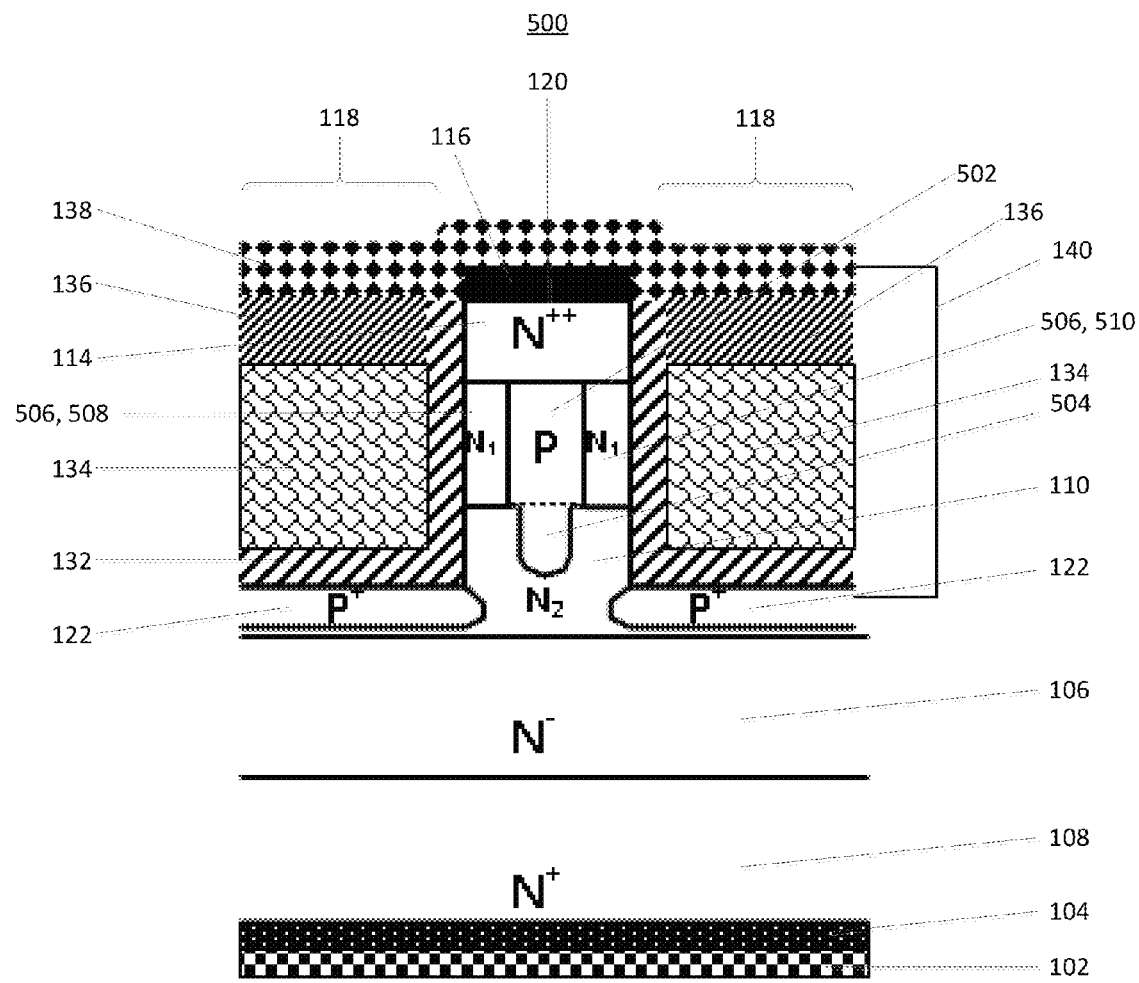

FIGS. 6A-6N illustrate an exemplary method of manufacturing a dual accumulation channel TI-AccuFET 500.

FIG. 6A illustrates a top view and FIG. 6B illustrates a cross-sectional view of wafer 600 along A-A. Wafer 600 may be created in a manner similar to that of wafer 200, as discussed above in connection with FIG. 2A.

FIGS. 6C and 6D illustrate the creation of thick, heavily doped source regions 114 in channel layer 112. FIG. 6C is a top view of wafer 600 while FIG. 4D is a cross sectional view of wafer 600 along A-A. Thick, heavily doped source regions 114 may be formed in a manner similar to that of wafer 200, as described above in connection with FIGS. 2C and 2D.

FIGS. 6E, 6F and 6G illustrate the creation of U-shaped trenches 118 and mesas 120 in wafer 600. FIG. 6E is a top view, FIG. 6F is a cross sectional view along line A-A, and FIG. 6G is a 3D cross sectional view along line A-A of wafer 600. U-shaped trenches 118 may be created in a manner similar to those of wafer 200, as discussed above in connection with FIGS. 2E, 2F, and 2G.

FIGS. 6H, 6I, and 6J illustrate forming the first p-type region 122 in the bottom of trenches 118. FIG. 6H is a top view, FIG. 6I is a cross sectional view along line A-A, and FIG. 6J is a 3D cross sectional view along line A-A of wafer 600. First p-type region 122 may be created in a manner similar to that of wafer 600, as discussed above in connection with FIGS. 2H, 2I, and 2J.

FIGS. 6K, 6L, and 6M illustrate forming the second p-type region 502 and the third p-type region 504 in the current spreading layer 110 and channel layer 112, respectively. FIG. 6K is a top view, FIG. 6L is a cross sectional view along line A-A, and FIG. 6M is a 3D cross sectional view along line A-A of wafer 600. Arrows 602 illustrate the direction of tilted implantation of ions of the second conductivity type (e.g., p-type ions) into both sides of mesas 120. Tilted ion implantation performed on both sides of the mesas 120 may cause the second p-type region 502 and third p-type region 504 to form in the center of the mesas 120, where the concentration of ions of the second conductivity type is the highest. The doping concentration of p-type ions, width of the second p-type region 502, width of the third p-type region 504, and width of accumulation channels 508, 510 may be determined by several factors, as discussed above in connection with FIGS. 2K-2M.

Similar to wafer 200, as discussed above in connection with FIGS. 2C and 2D, the doping level of the thick, heavily doped source regions 114 may be high enough to prevent the thick, heavily doped source region 114 from being converted to a p-type region by subsequent p-type ion implantation(s). However, as a result of tilted ion implantation and/or vertical ion implantation, thick, heavily doped source region 114 may have some p-type impurities. P-type impurities in the thick, heavily doped source region 302 may arise where, for example, an implantation mask is not used during vertical and/or tilted implantation (e.g., where a self-aligned manufacturing process is utilized).

The tilted ion implantation and/or vertical ion implantation (s) may also introduce some p-type impurities into the remaining portion 506 of the channel layer as well as the remaining portion of the current spreading layer 512 (e.g., the portion of the current spreading layer 110 that excludes third p-type region 504). However the level of p-type impurities may be insufficient to change the remaining portion 506 of the channel layer and the remaining portion of the current spreading layer 512 from n-type regions to p-type regions. In an exemplary embodiment, the heavily doped source regions 114 may have been subject to both vertical and tilted ion implantation and therefore may have more p-type impurities than the remaining portion 506 of the channel layer and the remaining portion of the current spreading layer 512, which were only subjected to tilted ion implantation.

FIG. 6N illustrates forming drain overlay 102, drain electrode 104, source electrode 140, the gate dielectric layer 132, gate contact 134, trench-fill dielectric 136, and source overlay 138 on wafer 400 as well as forming electrical connector 142, which results in TI-AccuFET 500. Source electrode 140 and drain electrode 104 may be low resistivity contacts.

Figure 7:
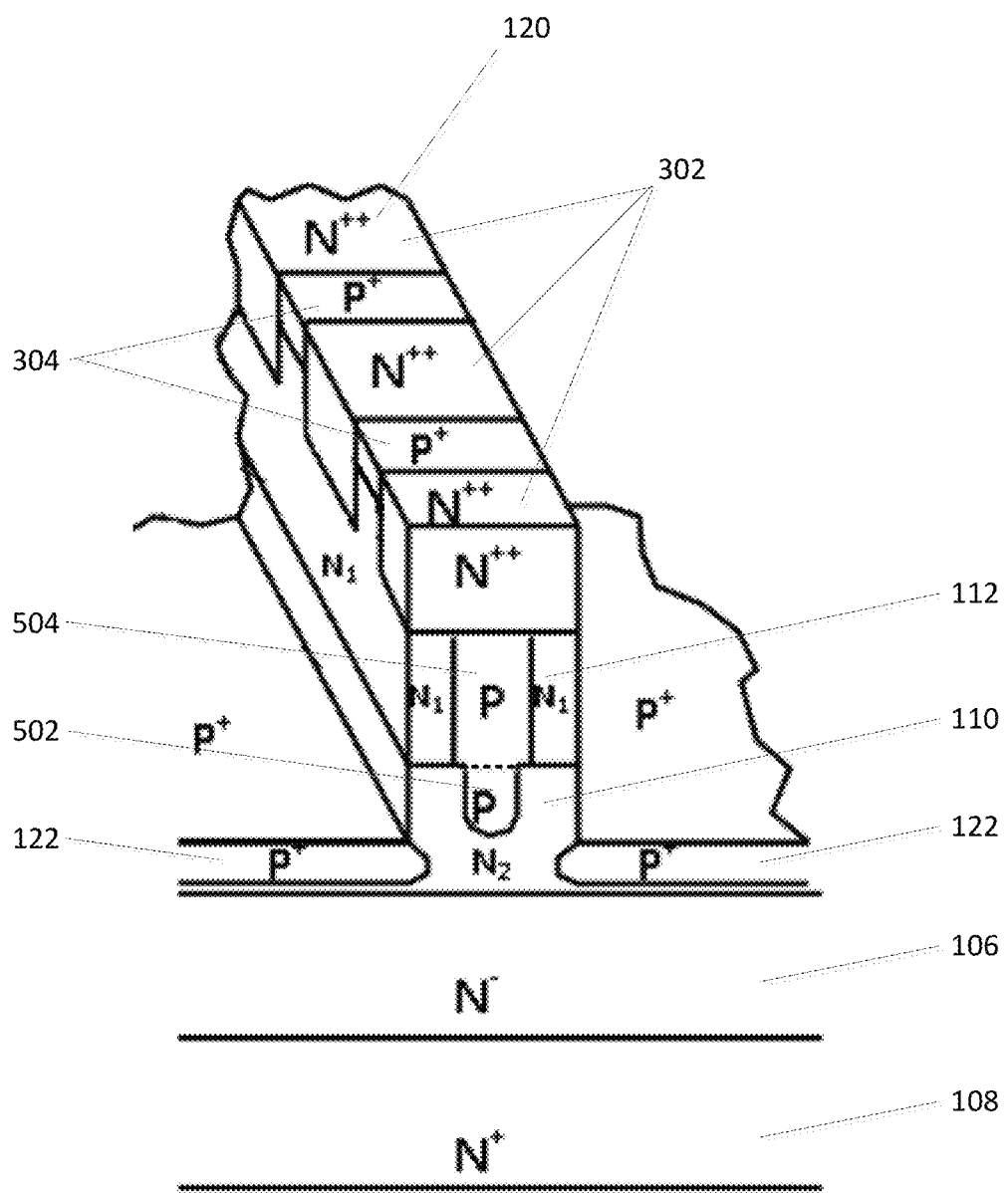
FIG. 7 illustrates a cross sectional view of another exemplary embodiment of a dual accumulation channel TI-AccuFET.

FIG. 7 illustrates a cross sectional view of an exemplary embodiment a dual accumulation channel TI-AccuFET 700 in accordance with the present invention. FIG. 7 illustrates to a unit cell of the TI-AccuFET 700 and a complete TI-AccuFET 700 is formed by repeating a large number of unit cells in parallel. TI-AccuFET 700 several elements that are similar to those of TI-AccuFET 100, such as drain overlay 102, drain electrode 104, lightly doped drift layer 106, buffer layer 108, current spreading layer 110, channel layer 112, source electrode 116, u-shaped trenches 118, mesas 120, first p-type region 122, gate dielectric layer 132, gate contact 134, trench-fill dielectric 136, source overlay 138, source electrode and electrical connection 142 that are similar to those of TI-AccuFET 100 (for clarity, source electrode 116, gate dielectric layer 132, gate contact 134, trench-fill dielectric 136, source electrode 140 and source overlay 138 are not shown in FIG. 7). TI-AccuFET 700 may further contain n-type thick, heavily doped source regions 302 and a fourth p-type region 304 formed in the channel layer 112. Thick, heavily doped source regions 302 and a fourth p-type region 304 may be created in a manner similar to those of TI-AccuFET 300 and wafer 400, as discussed above in connection with FIGS. 3 and 4.

Figure 8A:
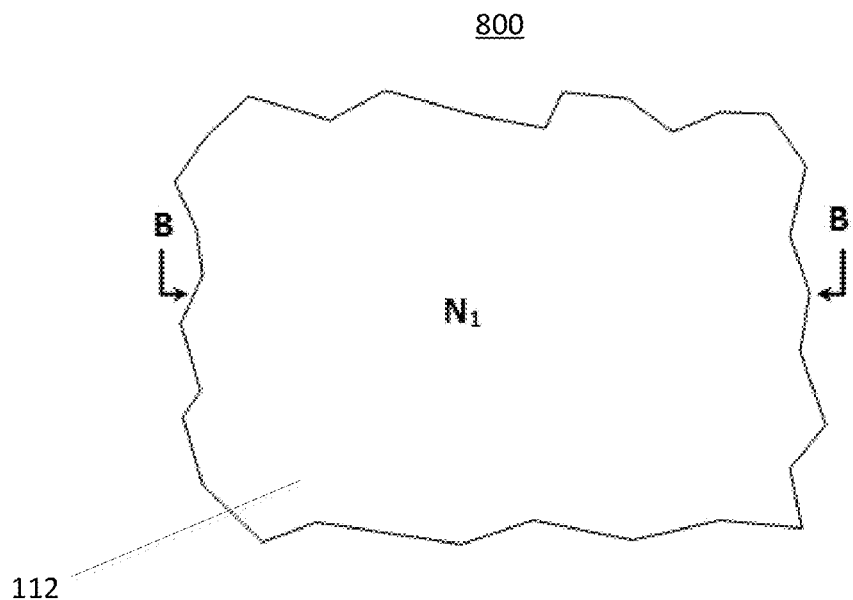
FIGS. 8A-8N illustrate another exemplary method of manufacturing a dual accumulation channel TI-AccuFET.
Figure 8B:
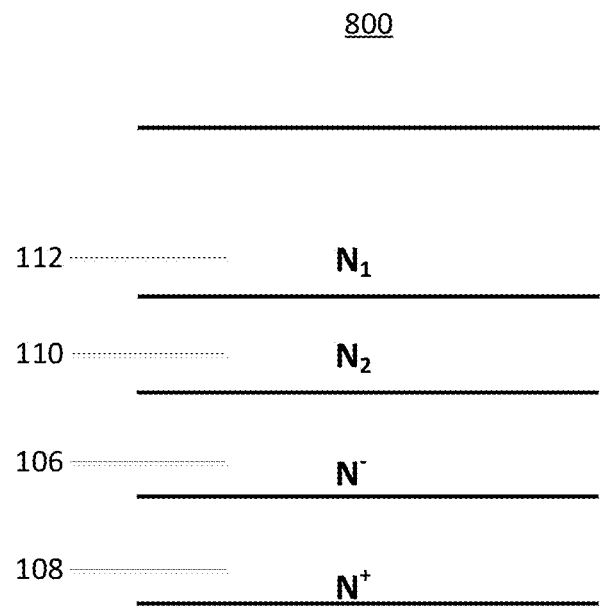
Figure 8C:
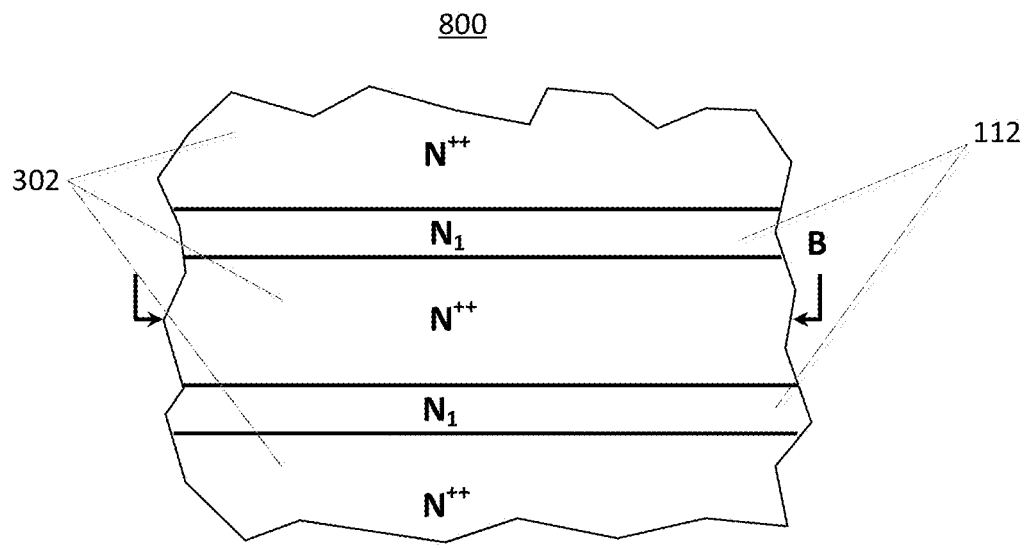
Figure 8D:
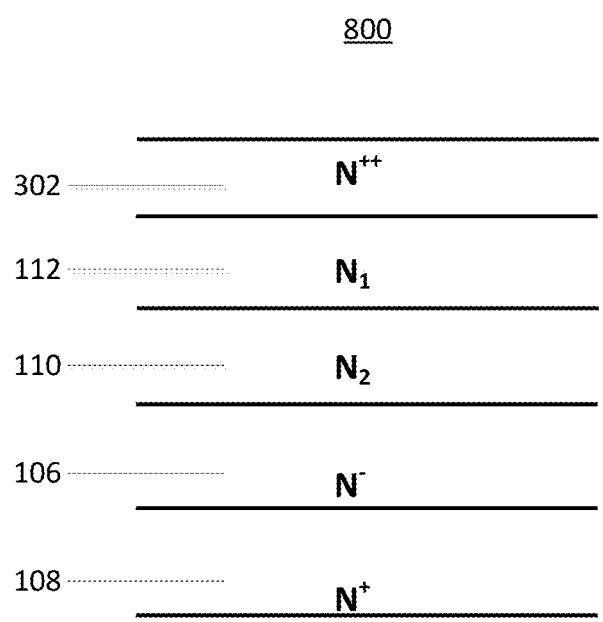
Figure 8N:
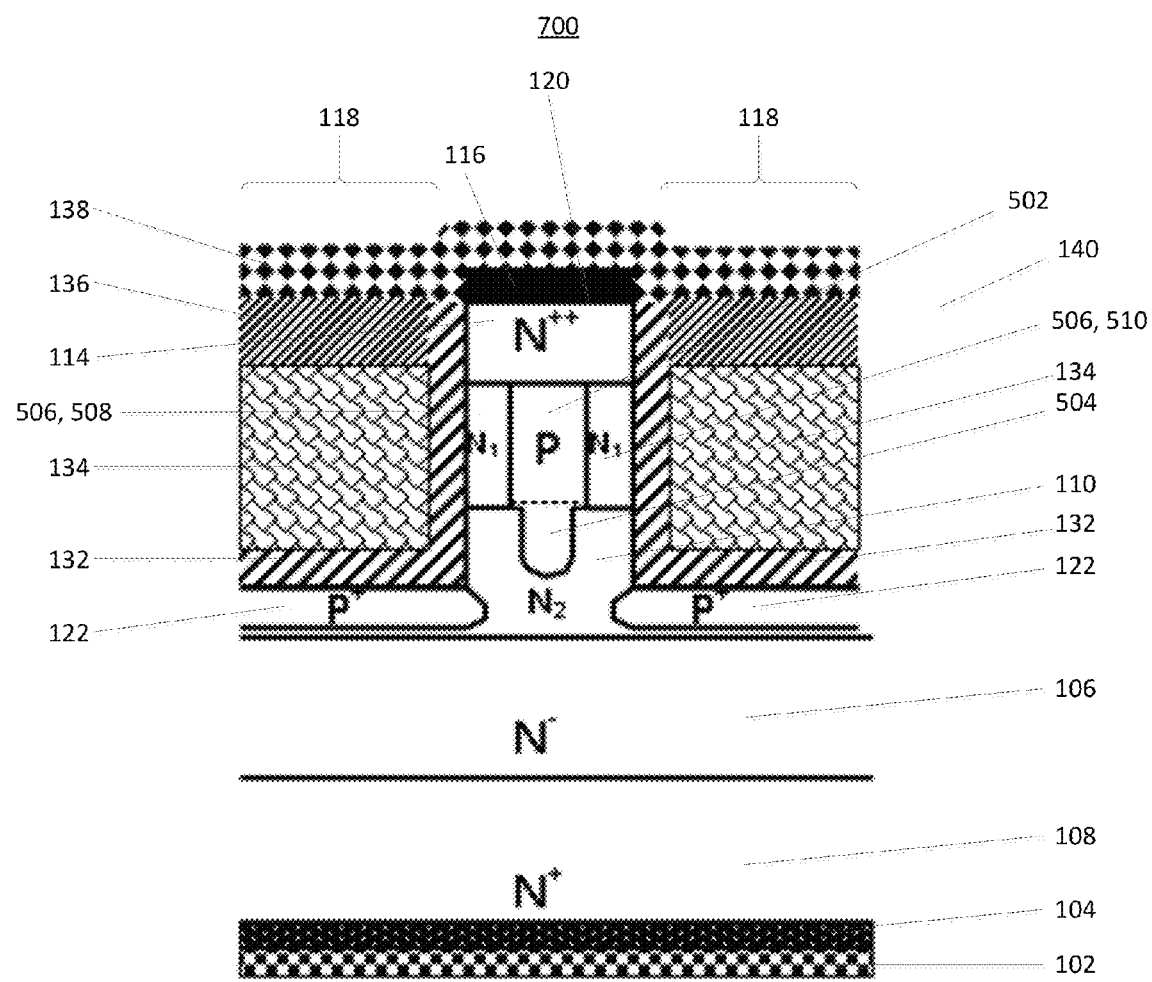

FIGS. 8A-8N illustrate another exemplary method of manufacturing dual accumulation channel TI-AccuFET 700.

FIG. 8A illustrates a top view and FIG. 8B illustrates a cross-sectional view of wafer 800 along B-B. Wafer 800 may be created in a manner similar to that of wafer 200, as discussed above in connection with FIG. 2A.

FIGS. 8C and 8D illustrate the creation of thick, heavily doped source regions 702 in channel layer 112. FIG. 8C is a top view of wafer 800 while FIG. 8D is a cross sectional view of wafer 800 along B-B. One or more thick, heavily doped source regions 302 may be formed on channel layer 112 in a manner similar to thick, heavily doped source regions 302, described above in connection with FIG. 4.

FIGS. 8E, 8F and 8G illustrate the creation of U-shaped trenches 118 and mesas 120 in wafer 800. FIG. 8E is a top view, FIG. 8F is a cross sectional view along line B-B, and FIG. 8G is a 3D cross sectional view along line A-A of wafer 800. U-shaped trenches 118 may be created in a manner similar to those of wafer 200, as discussed above in connection with FIGS. 2E, 2F, and 2G.

FIGS. 8H, 8I, and 8J illustrate forming the first p-type region 122 in the bottom of trenches 118 and fourth p-type region 304 on the top of channel layer 112. FIG. 8H is a top view, FIG. 8I is a cross sectional view along line B-B, and FIG. 8J is a 3D cross sectional view along line A-A of wafer 800. The first p-type region 122 in the bottom of trenches 118 and the fourth p-type region 304 on the top of channel layer 112 may be formed in a manner similar to those of the first p-type region 122 and fourth p-type region 304, as described above in connection with FIGS. 4H-4J.

FIGS. 8K, 8L, and 8M illustrate forming the second p-type region 502 and the third p-type region 504 in the current spreading layer 110 and channel layer 112, respectively. FIG. 8K is a top view, FIG. 8L is a cross sectional view along line B-B, and FIG. 8M is a 3D cross sectional view along line A-A of wafer 800. Second p-type region 502, third p-type region 504, and accumulation channels 508, 510 may be formed in a manner similar to those of wafer 600, as discussed above in connection with FIGS. 6K, 6L, and 6M.

FIG. 8N illustrates forming drain overlay 102, drain electrode, 104, source electrode 140, the gate dielectric layer 132, gate contact 134, trench-fill dielectric 136, and source overlay 138 on wafer 400 as well as forming electrical connector 142, which results in TI-AccuFET 700. Source electrode 140 and drain electrode 104 may be low resistivity contacts.

Figure 9:
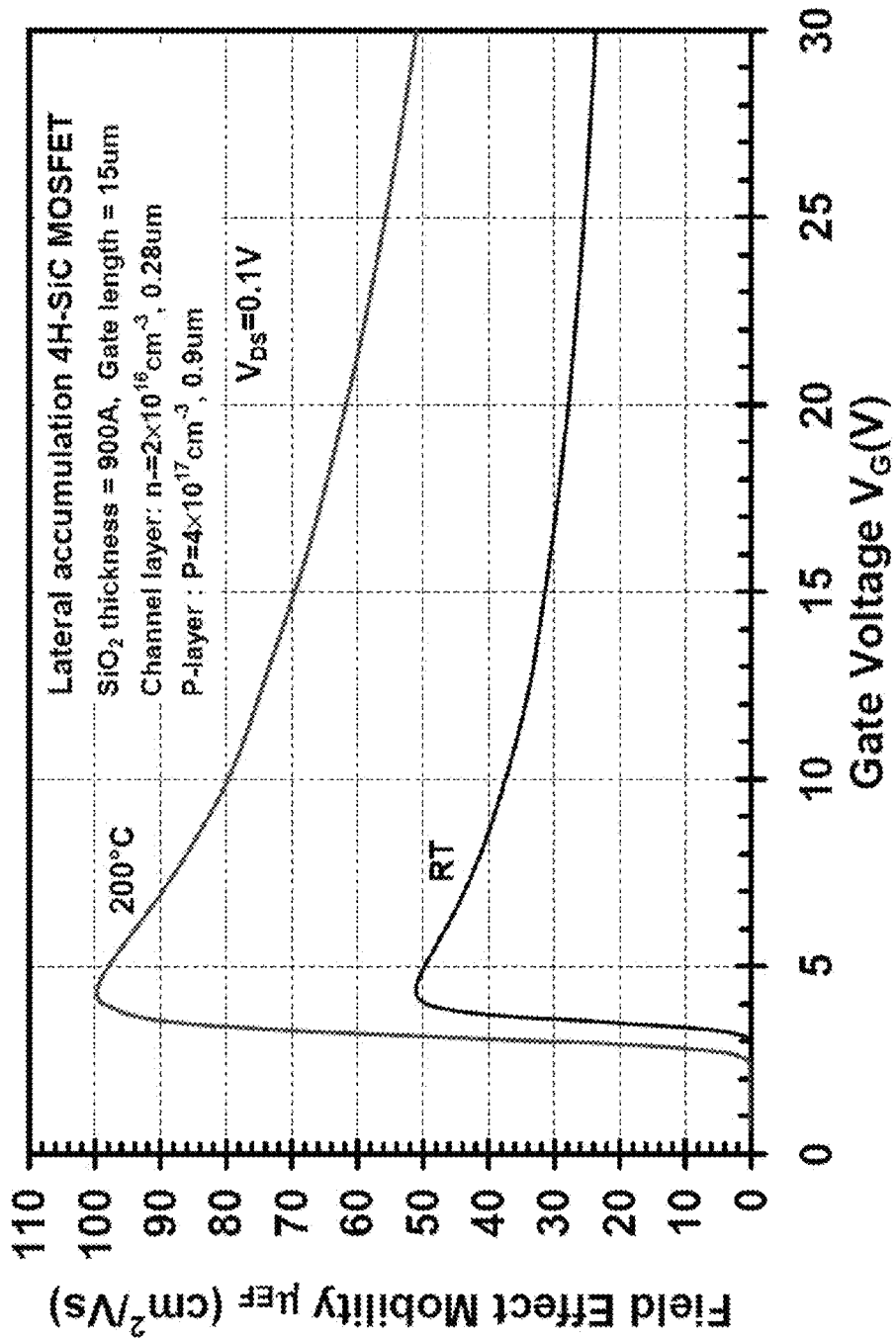
FIG. 9 illustrates an exemplary electron accumulation channel mobility model.

FIG. 9 illustrates an exemplary electron channel mobility model used in FIGS. 10-14C according to an exemplary embodiment of the present invention.

Figure 10:
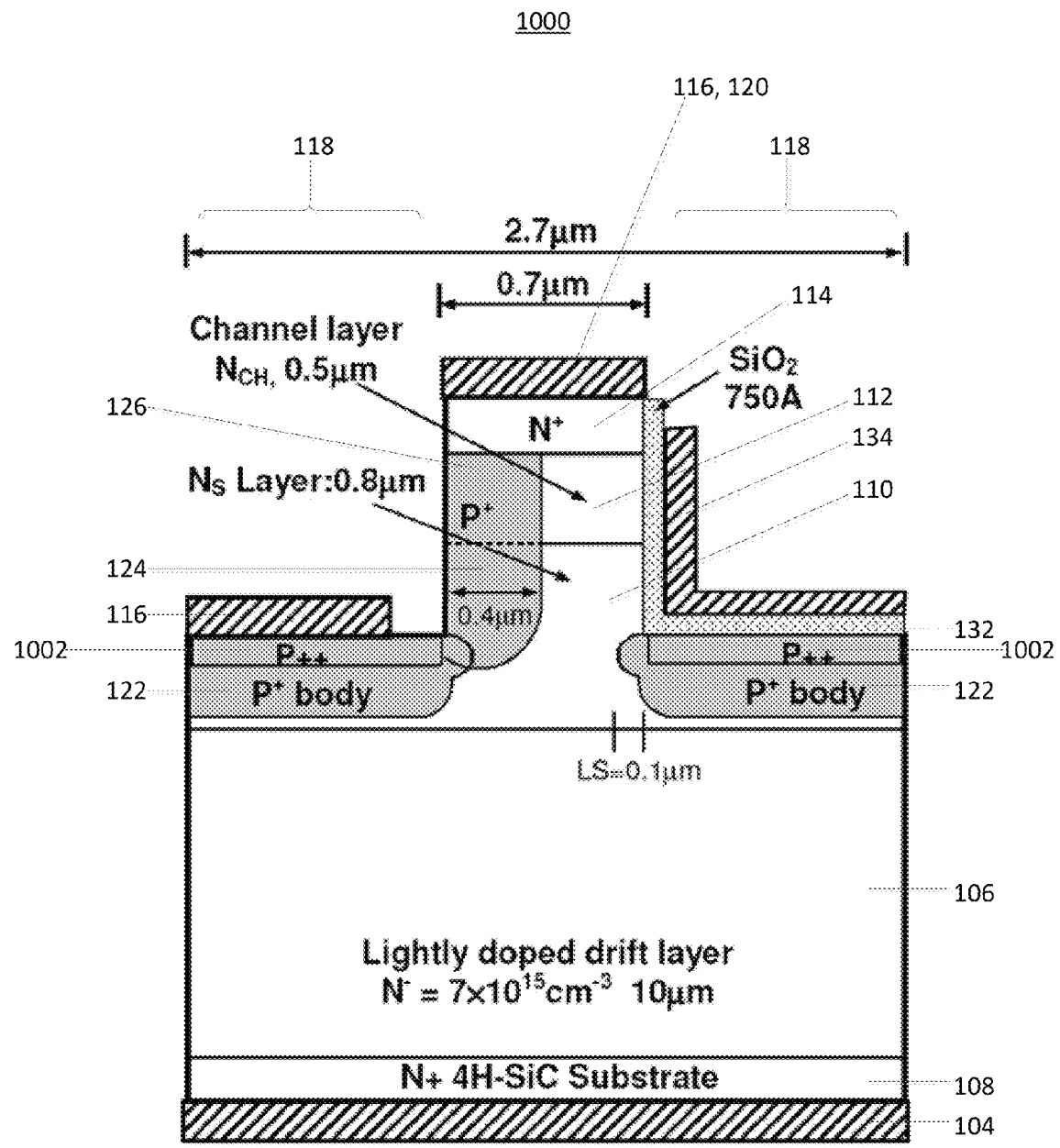
FIG. 10 illustrates a 2D model of an exemplary TI-AccuFET having a single accumulation channel.

FIG. 10 illustrates a 2D model of an exemplary TI-AccuFET 1000 having a single accumulation channel, in accordance with an exemplary embodiment of the present invention.

FIG. 10 illustrates an exemplary TI-AccuFET 1000 having a single accumulation channel that is similar to TI-AccuFET 100 (as shown and described in connection with FIGS. 1-2N above). Additionally, TI-AccuFET 1000 contains an additional p-type region 1002 located in a portion of the current spreading layer 110 in the bottom of trenches 118. In FIG. 10, additional p-type region 1002 has a P++ doping and may be formed by vertically implanting P++ ions. In the exemplary embodiment shown in FIG. 10, the implantation of P++ ions in additional p-type region 1002 may be shallow in order to facilitate low-resistance electric connection to p+ implants across the device active area. P+ implantation in the first p-type region 122 may be deeper than p++ implantation in additional p-type region 1002 in order to form a "blocking" pn-junction, which would support high voltage. Similarly, TI-AccuFET 300, TI-AccuFET 500, and TI-AccuFET 700 (as shown and described above) may contain an additional p-type region 1002 in the bottom of trenches 118, as described above with connection with FIG. 10.

Figure 11C:
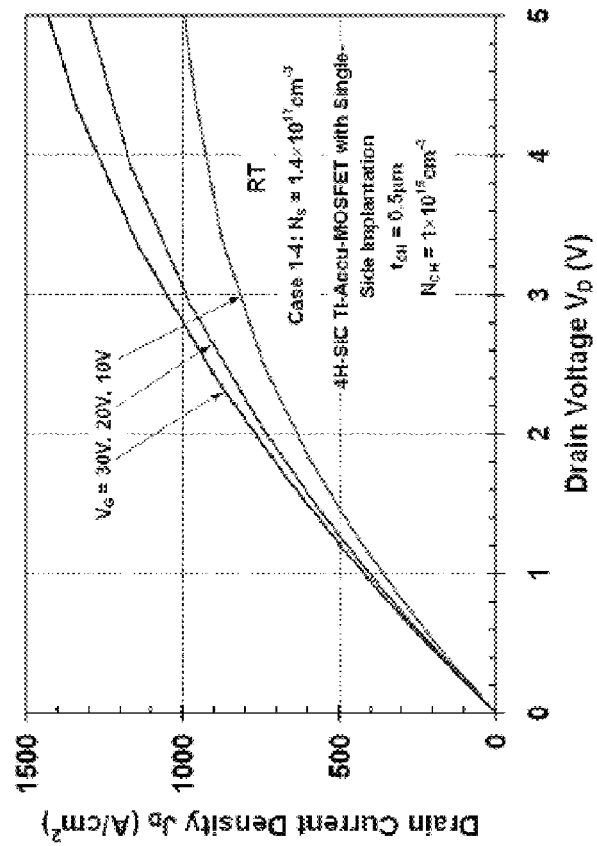
FIGS. 11A-11C depict an exemplary computer modeling results for an exemplary TI-AccuFET.
Figure 11A:
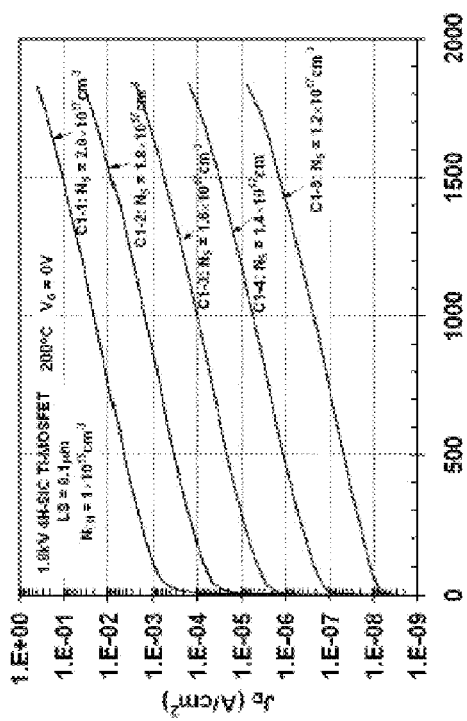
Figure 11B:
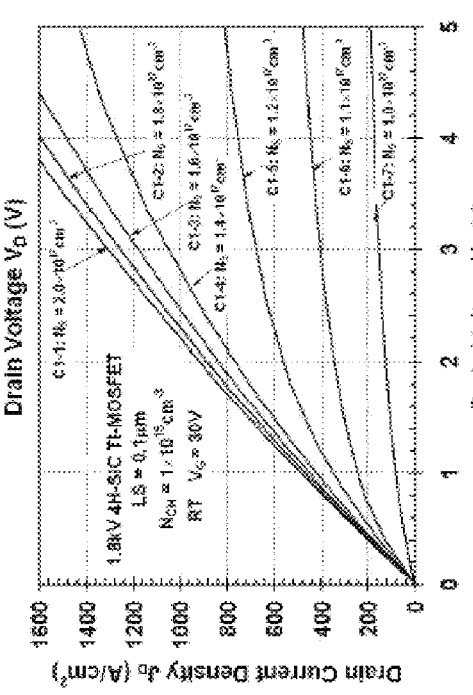

FIGS. 11A-11C depict an exemplary computer modeling results for exemplary TI-AccuFET 1000. FIGS. 11A and 11B depict simulated IV characteristics for various doping levels the current spreading layer 1002 of TI-AccuFET 1000. FIG. 11C depicts simulated IV characteristics (dependence on gate bias) for TI-AccuFET 1000. These modeling results of TI-AccuFET 1000 show that greater than 1800V blocking may be achievable with ~2.3 mΩ–cm2 specific on-resistance at 20V gate bias. Series resistance of the substrate is not included in the above modeling, as it can be reduced by substrate thinning process.

Figure 12:
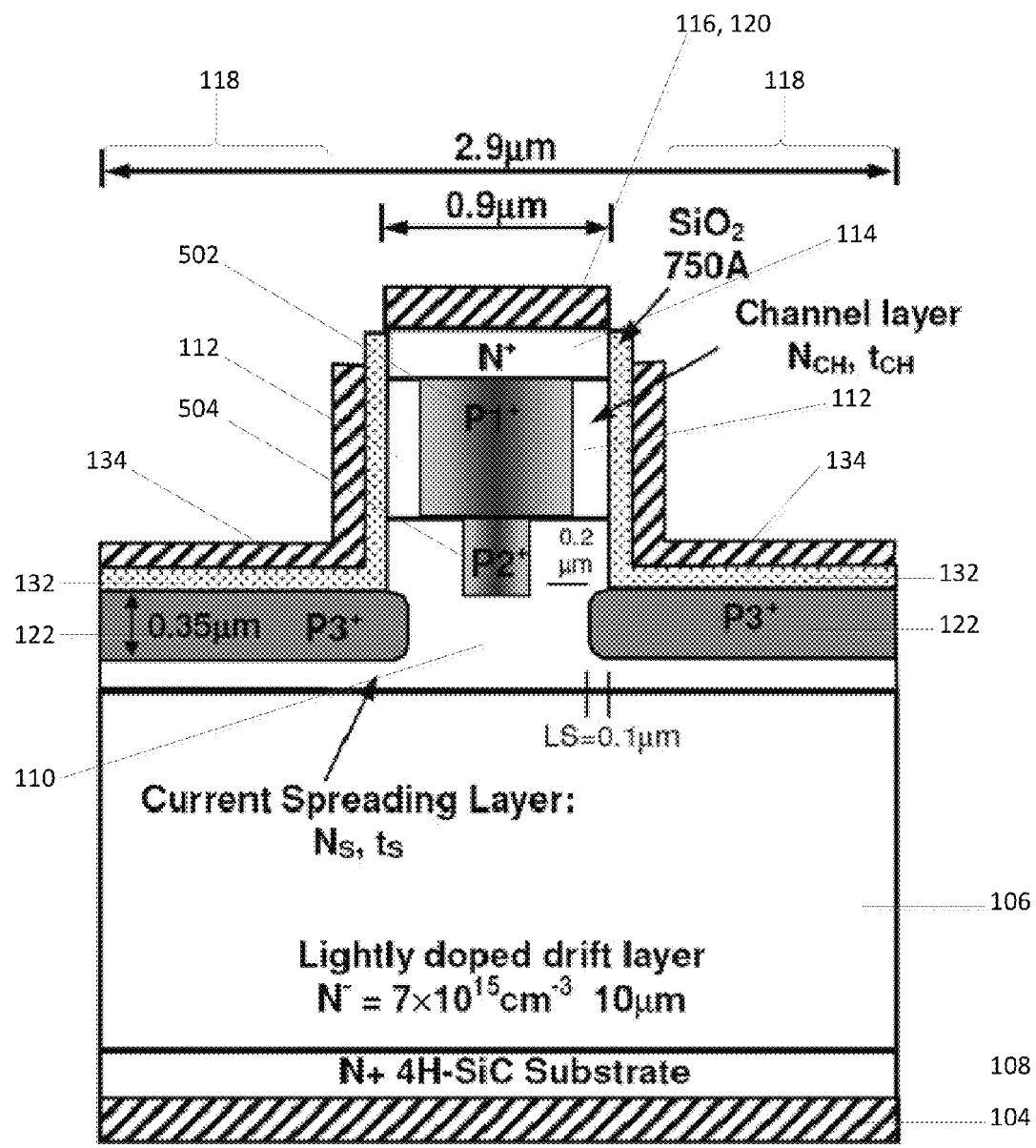
FIG. 12 illustrates a 2D model of an exemplary TI-AccuFET having dual accumulation channels.

FIG. 12 illustrates a 2D model of a TI-AccuFET 1200 having dual accumulation channels, in accordance with an exemplary embodiment of the present invention.

Figure 13:
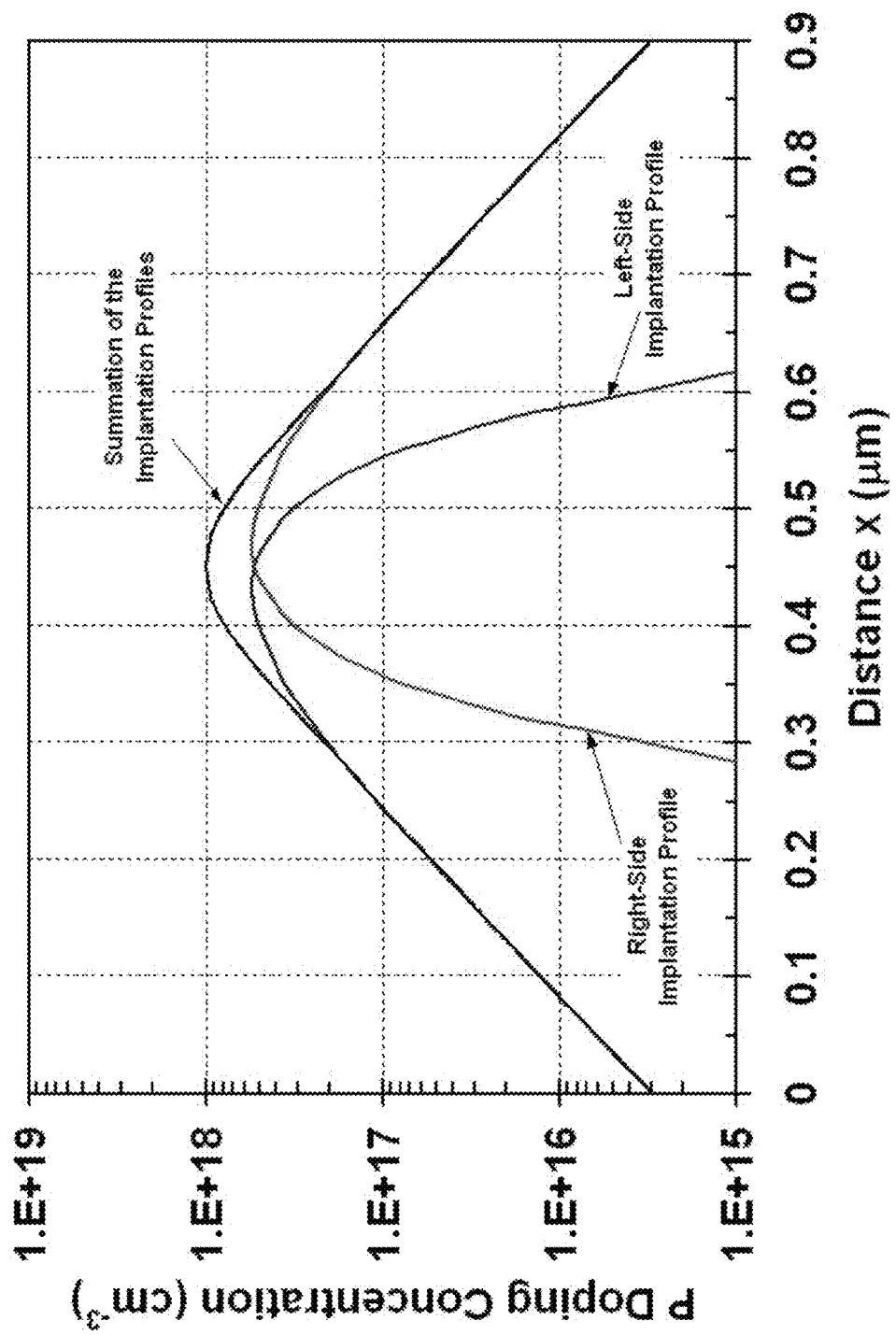
FIG. 13 illustrates the p-type implantation profile across the mesa cross section of an exemplary TI-AccuFET.

FIG. 13 illustrates the p-type implantation profile across the mesa 1202 cross section of TI-AccuFET 1200.

Figure 14C:
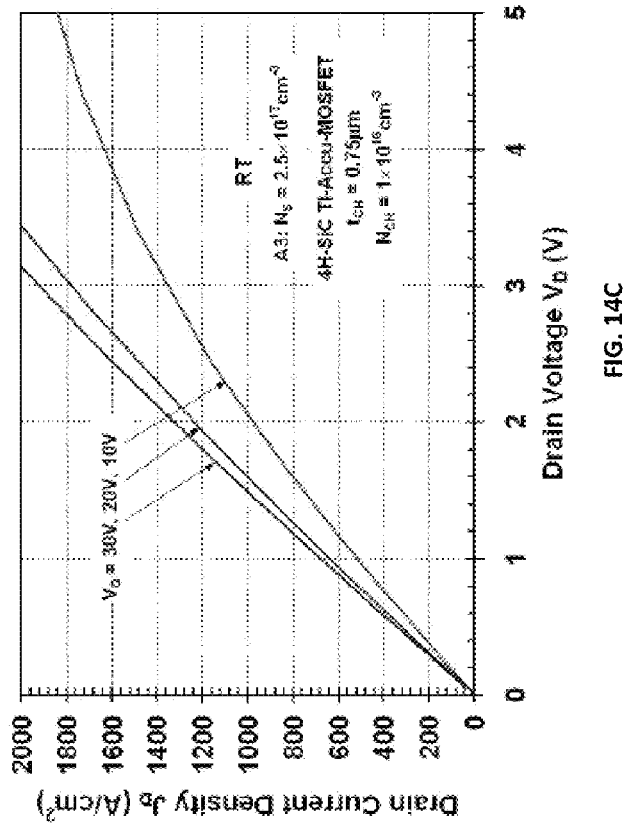
FIGS. 14A, 14B, and 14C depict exemplary computer modeling results for an exemplary TI-AccuFET.
Figure 14A:
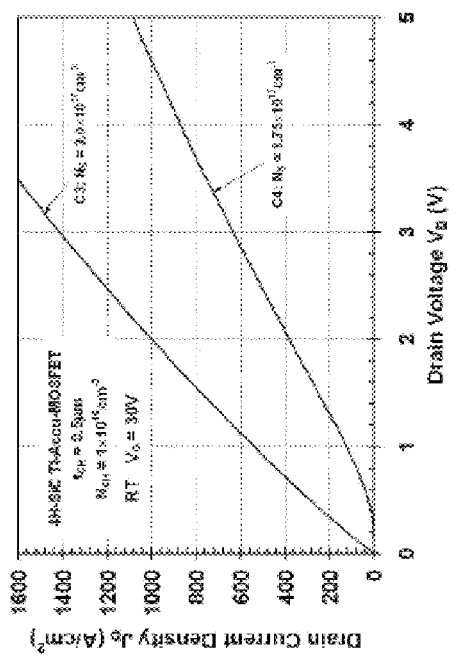
Figure 14B:
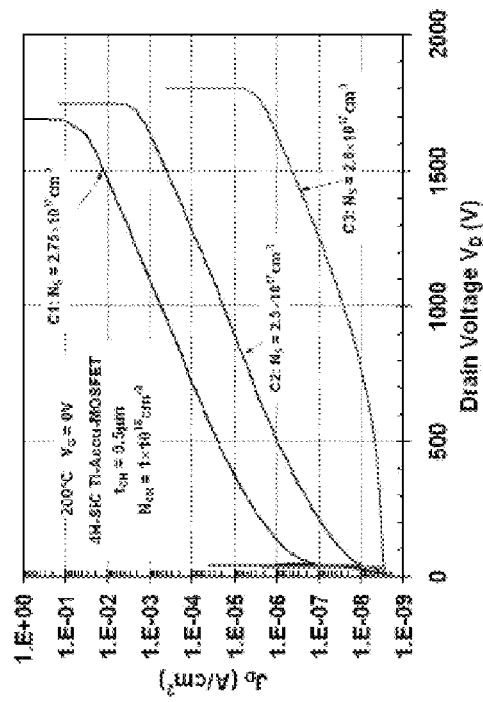

FIGS. 14A, 14B, and 14C depict exemplary computer modeling results for TI-AccuFET 1200. FIGS. 14A and 14B depict simulated IV characteristics for various doping levels the current spreading layer 1204 of TI-AccuFET 1200. FIG. 14C depicts simulated IV characteristics (dependence on gate bias) for TI-AccuFET 1200. These modeling results of TI-AccuFET 1200 show that greater than 1800V blocking may be achievable with ~1.5 mΩ–cm2 specific on-resistance at 20V gate bias. Series resistance of the substrate is not included in the above modeling, as it can be reduced by substrate thinning process.

In accordance with the exemplary embodiments of the invention described above, various TI-AccuFETs have been described which possess an epitaxial structure with only n-type layers that requires no epitaxial regrowth or deep ion implantations. Additionally, while the above description involved primarily TI-AccuFETs, a person of ordinary skill would understand that the underlying techniques can be applied to AccuFETs, lateral MOSFETs and MOS-based power IC.

When ranges are used herein for physical properties, such as molecular weight, or chemical properties, such as chemical formulae, all combinations, and sub combinations of ranges for specific embodiments therein are intended to be included.

The disclosures of each patent, patent application, and publication cited or described in this document are hereby incorporated herein by reference, in its entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed:

1. An accumulation mode metal-oxide-semiconductor field-effect transistor (AccuFET) comprising:
   a drain electrode;
   a lightly doped drift layer of a first conductivity type formed on top of the drain electrode;
   a current spreading layer of the first conductivity type formed on top of the drift layer;
   a channel layer of the first conductivity type formed on top of the current spreading layer;
   a thick, heavily doped source region of the first conductivity type comprised of a first portion of the channel layer adjacent to the top surface of the channel layer;
   a plurality of U-shaped trenches formed in the current spreading layer and channel layer; the trenches each having a bottom surface, a first side surface, and a second side surface; the trenches extending from the top of the channel layer, through the channel layer, and into the current spreading layer; and the bottom of the trenches being surrounded by the spreading layer;
   a source electrode formed on top of the source region;
   a first region of a second conductivity type formed in a first portion of the current spreading layer adjacent to the bottom surfaces of the U-shaped trenches, a second region of the second conductivity type formed in a second portion of the channel layer adjacent to the first side surfaces of the U-shaped trenches, and a third region of the second conductivity type formed in a second portion of the current spreading layer adjacent to the first side surfaces of the U-shaped trenches, the first region of the second conductivity type being formed using tilted ion implantation;
   an accumulation channel comprised of a third portion of the channel layer of the first conductivity type adjacent to the second side surfaces of the U-shaped trenches; and
   a gate contact electrically adjacent to the accumulation channel and separated from the accumulation channel by a dielectric layer.

2. The AccuFET of claim 1, wherein the accumulation channel has a p-type impurity concentration that is less than the n-type concentration of the accumulation channel and less than the p-type concentration of the first region of the second conductivity type.

3. The AccuFET of claim 1, wherein part of the first region of the second conductivity type formed in first portion of the current spreading layer adjacent to the bottom surfaces of the U-shaped trenches extends past the second side surface of the U-shaped trenches.

4. The AccuFET of claim 1, further comprising a buffer layer formed between the drain electrode and the lightly doped drift layer, wherein the buffer layer is comprised of 4H—SiC.

5. The AccuFET of claim 1, wherein the thick, heavily doped source region of the first conductivity type does not convert from the first conductivity type to the second conductivity type when subjected to ion implantation.

6. The AccuFET of claim 1, wherein the thick, heavily doped source region of the first conductivity type is an epitaxial layer formed on top of the channel layer or a region of the first conductivity type implanted in the channel layer.

7. The AccuFET of claim 1, further comprising a fourth region of the second conductivity type formed in a third portion of the channel layer adjacent to the top surface of the channel layer.

8. The AccuFET of claim 1, wherein the source electrode and the first region of the second conductivity type are electrically connected within the unit cell.

9. The AccuFET of claim 1, wherein the thick, heavily doped source region of the first conductivity type has a p-type impurity concentration that is greater than the p-type impurity concentration of the accumulation channel and greater than the p-type concentration of the first region of the second conductivity type.

10. A self-aligned method of forming an accumulation mode metal-oxide-semiconductor field-effect transistor (AccuFET) comprising:
    forming a lightly doped drift layer of a first conductivity type on top of a drain electrode;
    forming a current spreading layer of the first conductivity type on top of the drift layer;
    forming a channel layer of the first conductivity type on top of the current spreading layer;
    forming a thick, heavily doped source region of the first conductivity type comprised of a first portion of the channel layer adjacent to the top surface of the channel layer;
    forming a plurality of U-shaped trenches in the current layer and channel layer through an etching process; the trenches each having a bottom surface, a first side surface, and a second side surface; the trenches extending from the top of the channel layer, through the channel layer, and into the current spreading layer; and the bottom of the trenches being surrounded by the spreading layer;
    implanting to form a first region of a second conductivity type in a first portion of current spreading layer adjacent to the bottom surface of the U-shaped trenches, the first region of the second conductivity type being formed using vertical ion implantation;
    implanting to form a second region of the second conductivity type in a second portion of the channel layer and a second portion of the current spreading layer adjacent to the first side surface of the U-shaped trenches, the second region of the second conductivity type being formed using tilted ion implantation, the ion implantation defining the size of an accumulation channel as a function of a width of the second region of the second conductivity type, the accumulation channel comprising a third portion of the channel layer of the first conductivity type adjacent to the second side surface of the U-shaped trenches;
    forming a source electrode on top of the source region; and
    forming a gate contact adjacent to the accumulation channel and separated from the accumulation channel by a dielectric layer.

11. The method of claim 10, wherein the accumulation channel has a P-type impurity concentration that is less than the n-type concentration of the accumulation channel and less than the p-type concentration of the second region of the second conductivity type.

12. The method of claim 10, wherein a portion of the first region of the second conductivity type extends past the second side surface of the U-shaped trenches.

13. The method of claim 10, further comprising forming a buffer layer between the drain electrode and the lightly doped drift layer, wherein the buffer layer is comprised of 4H—SiC.

14. The method of claim 10, wherein the thick, heavily doped source region of the first conductivity type does not convert from the first conductivity type to the second conductivity type when subjected to ion implantation.

15. The method of claim 10, wherein forming the thick, heavily doped source region of the first conductivity type on the channel layer comprises:
forming the thick, heavily doped source region of the first conductivity type on the channel layer epitaxially or in the channel layer using blanket n-type ion implantation.

16. The method of claim 10, wherein forming the thick, heavily doped source region of the first conductivity type on the channel layer comprises:
implanting to form the thick, heavily doped source region of the first conductivity type in the channel layer using selective ion implantation.

17. The method of claim 16, further comprising:
implanting to form a third region of the second conductivity type in a fourth portion of the channel layer adjacent to the top surface of the channel layer.

18. The method of claim 10, further comprising:
electrically connecting the source electrode and the first region of the second conductivity type within the unit cell.

19. The method of claim 10, wherein the thick, heavily doped source region of the first conductivity type has a p-type impurity concentration that is greater than the p-type impurity concentration of the accumulation channel and greater than the p-type impurity concentration of the first region of the second conductivity type.

20. An accumulation metal-oxide-semiconductor field-effect transistor (AccuFET) comprising:
a drain electrode;
a lightly doped drift layer of a first conductivity type formed on top of the drain electrode;
a current spreading layer of the first conductivity type formed on top of the drift layer;
a channel layer of the first conductivity type formed on top of the current spreading layer;
a thick, heavily doped source region of the first conductivity type comprised of a first portion of the channel layer adjacent to the top surface of the channel layer;
a plurality of U-shaped trenches formed in the current spreading layer and channel layer;
the trenches each having a bottom surface, a first side surface, and a second side surface; the trenches extending from the top of the channel layer, through the channel layer, and into the current spreading layer; and the bottom of the trenches being surrounded by the spreading layer;
a plurality of mesas defined by the plurality of U-shaped trenches; the mesas having a top surface, a first side surface and a second side surface, the mesas extending from the bottom surface of the U-shaped trenches, through the current spreading layer and the channel layer to the top of the channel layer;
source electrodes formed on top of the mesas;
a first accumulation channel comprised of a first portion of the current spreading layer and a second portion of the channel layer of the mesas immediately adjacent to the first side surface of the U-shaped trenches;
a second accumulation channel comprised of a second portion of the current spreading layer and a third portion of the channel layer of the mesas immediately adjacent to the second side surface of the U-shaped trenches;
a first region of a second conductivity type formed in a third portion of the current spreading layer adjacent to the bottom surface of the U-shaped trenches;
a second region of the second conductivity type formed in a fourth portion of the current spreading layer and a fourth portion of the channel layer of the mesas, the second region of the second conductivity type being formed using tilted ion implantation, the second region of the second conductivity type being located between the first accumulation channel and the second accumulation channel; and
a gate contact adjacent to the accumulation channel and separated from the accumulation channel by a dielectric layer.

21. The AccuFET of claim 20, wherein the first accumulation channel and the second accumulation channel have a p-type impurity concentration that is less than the n-type concentration of the first accumulation channel and the second accumulation channel and less than the p-type concentration of the second region of the second conductivity type.

22. The AccuFET of claim 20, wherein the width of the second region of the second conductivity type formed in the current spreading layer is less than the width of the second region of the second conductivity type formed in the channel layer.

23. The AccuFET of claim 20, wherein the width of the first region of the second conductivity type is greater than the width of the bottom surface of the U-shaped trench; and wherein part of the first region of the second conductivity type extends past the first side surface and the second side surface of the U-shaped trenches.

24. The AccuFET of claim 20, further comprising a buffer layer formed between the drain electrode and the lightly doped drift layer, wherein the buffer layer is comprised of 4H—SiC.

25. The AccuFET of claim 20, wherein the thick, heavily doped source region of the first conductivity type does not convert from the first conductivity type to the second conductivity type when subjected to ion implantation.

26. The AccuFET of claim 20, wherein the thick, heavily doped source region of the first conductivity type is an epitaxial layer formed on top of the channel layer or a region of the first conductivity type implanted in the channel layer.

27. The AccuFET of claim 20, further comprising a third region of the second conductivity type formed in a fourth portion of the channel layer adjacent to the top surface of the channel layer.

28. The AccuFET of claim 20, wherein the source electrode and the first region of the second conductivity type are electrically connected within the unit cell.

29. The AccuFET of claim 20, wherein the thick, heavily doped source region of the first conductivity type has a p-type impurity concentration that is greater than the p-type impurity concentration of the first and second accumulation channels and greater than the p-type concentration of the first and second regions of the second conductivity type.

30. A self-aligned method of forming an accumulation mode metal-oxide-semiconductor field-effect transistor (AccuFET) comprising:
forming a lightly doped drift layer of a first conductivity type on top of a drain electrode;
forming a current spreading layer of the first conductivity type on top of the drift layer;
forming a channel layer of the first conductivity type on top of the current spreading layer;

forming a thick, heavily doped source region of the first conductivity type comprised of a first portion of the channel layer adjacent to the top surface of the channel layer;

forming a plurality of U-shaped trenches in the current spreading layer and channel layer through an etching process; the trenches having a bottom surface, a first side surface, and a second side surface; the trenches extending from the top of the channel layer, through the channel layer, and into the current spreading layer; and the bottom of the trenches being surrounded by the spreading layer; the plurality of U-shaped trenches defining a plurality of mesas; the mesas having a top surface, a first side surface and a second side surface, the mesas extending from the bottom surface of the U-shaped trenches, through the current spreading layer and the channel layer to the top of the channel layer;

forming source electrodes on top of the mesas;

performing a vertical ion implementation to form a first region of a second conductivity type in the bottom surface of the U-shaped trenches;

performing tilted ion implementation to form a second region of the second conductivity type in a second, middle portion of the current spreading layer and channel layer of the mesas, the width of the second region of the second conductivity type in the channel layer defining the width of an accumulation channel, the accumulation channel comprising a third portion of the channel layer of the first conductivity type located on either side of the second portion of the channel layer; and a gate contact adjacent to the accumulation channel and separated from the accumulation channel by a dielectric layer.

31. The method of claim 30, wherein the accumulation channel has a p-type impurity concentration that is less than the n-type concentration of the accumulation channel and less than the p-type concentration of the second region of the second conductivity type.

32. The method of claim 30, wherein the width of the second region of the second conductivity type formed in the current spreading layer is less than the width of the second region of the second conductivity type formed in the channel layer.

33. The method of claim 30, wherein the width of the first region of the second conductivity type is greater than the width of the bottom surface of the U-shaped trench; and wherein a part of the first region of the second conductivity type extends past the first side surface and the second side surface of the U-shaped trench.

34. The method of claim 30, further comprising forming a buffer layer between the drain electrode and the lightly doped drift layer, wherein the buffer layer is comprised of 4H—SiC.

35. The method of claim 30, wherein the thick, heavily doped source layer does not convert from the first conductivity type to the second conductivity type when subjected to tilted ion implantation.

36. The method of claim 30, wherein forming the thick, heavily doped source region of the first conductivity type on the channel layer comprises:

forming the thick, heavily doped source region of the first conductivity type on the channel layer epitaxially or in the channel layer using blanket n-type ion implantation.

37. The method of claim 30, wherein forming the thick, heavily doped source region of the first conductivity type on the channel layer comprises:

implanting to form the thick, heavily doped source region of the first conductivity type in the channel layer using selective ion implantation.

38. The method of claim 37, further comprising:

implanting to form a third region of the second conductivity type in a fourth portion of the channel layer adjacent to the top surface of the channel layer.

39. The method of claim 30, further comprising:

electrically connecting the source electrode and the first region of the second conductivity type within the unit cell.

40. The method of claim 30, wherein the thick, heavily doped source region of the first conductivity type has a p-type impurity concentration that is greater than the p-type impurity concentration of the accumulation channel and greater than the p-type concentrations of the first and second regions of the second conductivity type.

* * * * *